(12) United States Patent
Saneyoshi et al.

(10) Patent No.: US 10,114,051 B2
(45) Date of Patent: Oct. 30, 2018

(54) MONITORING DEVICE, MONITORING SYSTEM, MONITORING METHOD, AND NON-TRANSITORY STORAGE MEDIUM

(71) Applicant: NEC Corporation, Tokyo (JP)

(72) Inventors: Eisuke Saneyoshi, Tokyo (JP); Ryo Hashimoto, Tokyo (JP); Kosuke Homma, Tokyo (JP); Koji Kudo, Tokyo (JP); Takahiro Toizumi, Tokyo (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 15/300,496

(22) PCT Filed: Jan. 23, 2015

(86) PCT No.: PCT/JP2015/051849
§ 371 (c)(1),
(2) Date: Sep. 29, 2016

(87) PCT Pub. No.: WO2015/151560
PCT Pub. Date: Oct. 8, 2015

(65) Prior Publication Data
US 2017/0176502 A1  Jun. 22, 2017

(30) Foreign Application Priority Data

Mar. 31, 2014 (JP) .................. 2014-071121

(51) Int. Cl.
*G01R 13/04* (2006.01)
*G01R 21/133* (2006.01)
*G01R 21/06* (2006.01)

(52) U.S. Cl.
CPC ........... *G01R 21/133* (2013.01); *G01R 21/06* (2013.01)

(58) Field of Classification Search
CPC .. G01R 21/133; G01R 21/06; G01R 19/0092; G01R 1/203; G01R 31/2642;
(Continued)

(56) References Cited

U.S. PATENT DOCUMENTS 4,872,121 A * 10/1989 Chan .................... G06F 11/348
  702/182
7,714,735 B2 * 5/2010 Rockwell ........... G01R 19/2513
  324/126

(Continued)

FOREIGN PATENT DOCUMENTS

JP  2003-9430  1/2003
JP  3403368    5/2003
(Continued)

OTHER PUBLICATIONS

International Search Report and Written Opinion dated Apr. 28, 2015, in corresponding PCT International Application.

*Primary Examiner* — Thang Le
(74) *Attorney, Agent, or Firm* — Finnegan, Henderson, Farabow, Garrett & Dunner, L.L.P.

(57) ABSTRACT

A monitoring device (10) includes: a unit-specific waveform data acquisition unit (12) that acquires unit-specific monitoring waveform data which is waveform data of at least one among total current consumption, a total input voltage, and total power consumption in a unit in which monitoring target electrical devices are installed; a first inference unit (13) that infers operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and a second inference unit (14) that infers the operation states of some of the monitoring target electrical devices based on a 2nd feature amount group including at least one kind of feature amount extracted from the (Continued)

unit-specific monitoring waveform data, and different from the 1st feature amount group and the training feature amount.

13 Claims, 21 Drawing Sheets

(58) Field of Classification Search
CPC ...... G01R 13/345; G01R 23/16; G01R 27/32; G01R 13/0272; H04L 41/06; H04L 41/16; H04L 41/5032; H04L 41/5009; G06F 9/3802; G06F 2221/2137
See application file for complete search history.

(56) References Cited

U.S. PATENT DOCUMENTS

| | | | | |
|---|---|---|---|---|
| 2015/0214768 A1* | 7/2015 | Matsuyama | ........... | G06Q 50/06 700/296 |
| 2015/0309092 A1* | 10/2015 | Yu | ............................. | H02J 3/24 702/66 |
| 2016/0041216 A1* | 2/2016 | Tang | ......................... | H02H 3/38 324/509 |
| 2016/0146864 A1* | 5/2016 | Kobayashi | ............... | H04Q 9/00 702/57 |

FOREIGN PATENT DOCUMENTS

| | | |
|---|---|---|
| JP | 2008-39492 | 2/2008 |
| JP | 4433890 | 3/2010 |
| JP | 2010-169567 | 8/2010 |
| JP | 4565511 | 10/2010 |
| JP | 2011-232061 | 11/2011 |

* cited by examiner

FIG. 3

| DEVICE ID | TEACHER DATA ID | TEACHER FEATURE AMOUNT | STATE |
|---|---|---|---|
| 0001 | D ON | × □ × × | DRYER IS POWERED ON |
| 0002 | A ON | □ □ □ □ | AIR-CONDITIONER IS POWERED ON |
| ⋮ | ⋮ | ⋮ | ⋮ |

FIG. 4

| DEVICE ID | TEACHER DATA ID | TEACHER FEATURE AMOUNT | STATE |
|---|---|---|---|
| 0001 | D ON to OFF | △△△△△ | POWER OF DRYER IS CHANGED FROM ON TO OFF |
| 0001 | A OFF to ON | ××△×× | POWER OF DRYER IS CHANGED FROM OFF TO ON |
| ⋮ | ⋮ | ⋮ | ⋮ |

FIG. 5

| DEVICE ID | TEACHER DATA ID | POWER VALUE BAND | REPRE-SENTATIVE VALUE | TEACHER FEATURE AMOUNT | STATE |
|---|---|---|---|---|---|
| 0001 | D 1(2.5) | GREATER THAN 0 W AND EQUAL TO OR LESS THAN 5 W | 2.5w | ○○○ | DRYER IS CONSUMING 2.5 W |
| 0001 | D 2(7.5) | GREATER THAN 5 W AND EQUAL TO OR LESS THAN 10 W | 7.5w | ××× | DRYER IS CONSUMING 7.5 W |
| .... | .... | .... | .... | .... | .... |
| 0001 | D 240(1197.5) | GREATER THAN 1195 W AND EQUAL TO OR LESS THAN 1200 W | 1197.5w | △△△ | DRYER IS CONSUMING 1197.5 W |

FIG. 7

| TEACHER DATA ID | POWER VALUE BAND | REPRE-SENTATIVE VALUE | TEACHER FEATURE AMOUNT | STATE |
|---|---|---|---|---|
| D 1 | EQUAL TO OR GREATER THAN 610 W AND EQUAL TO OR LESS THAN 615 W | 612.5w | ○ × ○ | DRYER IS CONSUMING 612.5 W |
| D 2 | EQUAL TO OR GREATER THAN 733 W AND EQUAL TO OR LESS THAN 738 W | 735.5w | □ □ × | DRYER IS CONSUMING 735.5 W |
| .... | .... | .... | .... | .... |
| D n | EQUAL TO OR GREATER THAN 1107 W AND EQUAL TO OR LESS THAN 1112 W | 1109.5w | ○ × × | DRYER IS CONSUMING 1109.5 W |

FIG. 10

| TEACHER DATA ID | TEACHER FEATURE AMOUNT | STATE |
|---|---|---|
| D ON + A ON | □□□× | DRYER AND AIR-CONDITIONER ARE POWERED ON |
| D ON + T ON | ××□□ | DRYER AND TELEVISION ARE POWERED ON |
| ⋮ | ⋮ | ⋮ |

FIG. 11

| DEVICE ID | STATE |
|---|---|
| 0001 | POWER ON |
| 0002 | POWER OFF |
| ⋮ | ⋮ |

FIG. 12

| TEACHER DATA ID | TEACHER FEATURE AMOUNT | STATE |
|---|---|---|
| D 1 (2.5) +A 1 (10) | ○ × ○ ○ × × | DRYER IS CONSUMING 2.5 W AND AIR-CONDITIONER IS CONSUMING 10 W |
| ⋮ | ⋮ | ⋮ |

FIG. 17

| TOTAL POWER CONSUMPTION | 2500w |
| AIR-CONDITIONER | 1000w |
| DRYER | 900w |
| REFRIGERATOR | 200w |
| ⋮ | |
| | HH:MI DD/MM/20YY |

MONITORING DEVICE, MONITORING SYSTEM, MONITORING METHOD, AND NON-TRANSITORY STORAGE MEDIUM

CROSS-REFERENCE TO RELATED PATENT APPLICATIONS

This application is a National Stage Entry of International Application No. PCT/JP2015/051849, filed Jan. 23, 2015, which claims priority from Japanese Patent Application No. 2014-071121, filed Mar. 31, 2014. The entire contents of the above-referenced applications are expressly incorporated herein by reference.

TECHNICAL FIELD invention relates to a monitoring device, a monitoring system, a monitoring method, and a program.

BACKGROUND ART

In recent years, as smart meters have become widespread, technologies for supplying users with total power consumption (instantaneous values) in predetermined units (a household, a company, a floor of one building, or the like) have been standardized. By providing not only total power consumption in the predetermined units but also power consumption (instantaneous values) of an electrical device as a single body used in the predetermined units, measures for more precise power saving are expected to be prompted.

Power consumption of an individual electrical device can be ascertained, for example, by mounting a measuring instrument on each electrical device. However, in the case of this method, a workload of mounting a measuring instrument on each electrical device is considerable. Further, a cost burden increases since the number of measurement instruments increases with an increase in the number of electrical devices.

The related technologies are disclosed in Patent Documents 1 to 6.

Patent Documents 1 and 2 disclose technologies for installing a measuring instrument in a power trunk line portion such as a power-feeding service entrance or a distribution board and inferring an operation state of each electrical device using measurement data (a total current consumption waveform or the like) measured with the measuring instrument. In the technologies, a feature amount (a training feature amount) at the time of operation of each electrical device is prepared in advance and a sum training feature amount in which the training feature amounts are summed in any combination is further prepared in advance. Then, based on feature amounts extracted from the measurement data measured in the power trunk line portion and the training feature amounts (including the sum training feature amounts) prepared in advance, an operation state of each electrical device is inferred.

Patent Document 3 discloses a technology for generating a training feature amount indicating a feature amount at the time of an operation of each electrical device. Specifically, pieces of predetermined data (current consumption or the like) are individually measured by operating electrical devices in a house to be measured one by one. A feature amount is extracted from the measured data of each of the electrical devices and the extracted feature amount is stored as a training feature amount.

Patent Document 4 discloses a power consumption measurement system that includes a data extraction unit and an inference unit. The data extraction unit extracts current waveform data averaged per one period of a commercial frequency of a total load current based on a total load current and a voltage measured at a predetermined position of a leading wire in an area of demand and extracts convex point information regarding a convex point indicating a point at which change in a current value is changed from an increase to a decrease or a point at which the change in the current value is changed from the decrease to the increase from the averaged current waveform data. The inference unit retains an inference model in which a classification of an electrical device, the convex point information, and power consumption are associated with each other in advance and individually infers the power consumption of the electrical device being in operation based on the convex point information extracted by the data extraction unit and the inference model.

Patent Document 5 discloses a remote electrical device monitoring method of inferring operation statuses of a plurality of electrical devices used by a customer. In the method, a total load current is measured at a power feeding line of a customer, the total load current is converted into a current for the basic wave and each harmonic, and a temporal difference in the current for the basic wave and each harmonic is obtained to generate current change data. The current change for the basic wave and each harmonic is separated into each component inferred as a device group having an identical harmonic intensity ratio through independent component analysis. Then, an operation status (current change) of each monitoring target device is inferred from the waveform of the current change for each component having an identical harmonic intensity ratio.

Patent Document 6 discloses a power consumption amount inference device that infers a power consumption amount of a load device to which power is supplied from a power system. The device receives an operation state signal indicating a value according to an operation state of a load device and determines whether the load device is an operated load device in an operation state based on the value indicated by the received operation state signal. As an inferred power consumption amount of a newly operated load device, a change amount in the total power consumption amount before and after the change is allocated. A previously allocated inferred power consumption amount is allocated as an inferred power consumption amount of an operated load device other than the newly operated load device to the operated load device.

RELATED DOCUMENT

Patent Document

[Patent Document 1] Japanese Patent No. 3403368
[Patent Document 2] Japanese Patent No. 4565511
[Patent Document 3] Japanese Patent No. 4433890
[Patent Document 4] Japanese Laid-open Patent Application Publication No. 2011-232061
[Patent Document 5] Japanese Laid-open Patent Application Publication No. 2003-9430
[Patent Document 6] Japanese Laid-open Patent Application Publication No. 2010-169567

SUMMARY OF THE INVENTION

Technical Problem

The present inventors have examined a technology for calculating power consumption (instantaneous value) of each monitoring target electrical device based on a monitoring feature amount extracted from measurement data (a total current consumption waveform or the like in a predetermined unit) measured in a distribution board or the like, a training feature amount prepared for each monitoring target electrical device, and the training feature amount (sum training feature amount) of each combination of monitoring target electrical devices generated by combining the training feature amounts of the monitoring target electrical devices.

In the case of the technology, as the number of monitoring target electrical devices increases, the number of training feature amounts (including the sum training feature amounts) used for a process of inferring power consumption of the monitoring target electrical devices increases. In particular, when the number of monitoring target electrical devices increases, the number of combinations of the monitoring target electrical devices considerably increases, and thus the number of sum training feature amounts considerably increases. In a case in which M is the number of monitoring target electrical devices, there are ${}_M C_M + {}_M C_{M-1}, {}_M C_{M-2}, \ldots + {}_M C_2$ combinations of the monitoring target electrical devices. It is necessary to prepare the sum training feature amounts corresponding to the number of combinations.

In a case in which the power consumption of each monitoring target electrical device is inferred, it is necessary to prepare the training feature amount corresponding to each of a plurality of power consumption states for each monitoring target electrical device. Therefore, a combination for preparing the sum training feature amounts is obtained by further subdividing each combination of the monitoring target electrical devices. As a result, the number of prepared training feature amounts further increases.

In the case of the technology, as described above, there is a problem that the number of training feature amounts (including the sum training feature amounts) used for the inference process is enormous. In this case, a processing load on the process of inferring the power consumption of each monitoring target electrical device using the training feature amount (including the sum training feature amount) increases.

An object of the present invention is to provide a technology for reducing the number of training feature amounts (including sum training feature amounts) used to infer power consumption of each monitoring target electrical device.

Solution to Problem

According to an aspect of the present invention, there is provided a monitoring device including: a unit-specific waveform data acquisition unit that acquires unit-specific monitoring waveform data which is waveform data of at least one among total current consumption, a total input voltage, and total power consumption in a unit in which monitoring target electrical devices are installed; a first inference unit that infers operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and a second inference unit that infers the operation states of some of the monitoring target electrical devices based on a 2nd feature amount group including at least one kind of feature amount extracted from the unit-specific monitoring waveform data and different from the 1st feature amount group, and the training feature amount.

According to another aspect of the present invention, there is provided a monitoring system including: the monitoring device; and a repeating device that acquires unit-specific monitoring waveform data which is waveform data of at least one of total current consumption, a total input voltage, and total power consumption measured by a measuring instrument installed in a unit in which monitoring target electrical devices are installed and transmits the unit-specific monitoring waveform data to the monitoring device.

According to still another aspect of the present invention, there is provided a monitoring method performed by a computer, the method including: a unit-specific waveform data acquisition step of acquiring unit-specific monitoring waveform data which is waveform data of at least one among total current consumption, a total input voltage, and total power consumption in a unit in which monitoring target electrical devices are installed; a first inference step of inferring operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and a second inference step of inferring the operation states of some of the monitoring target electrical devices based on a 2nd feature amount group including at least one kind of feature amount extracted from the unit-specific monitoring waveform data and different from the 1st feature amount group, and the training feature amount.

According to still another aspect of the present invention, there is provided a program causing a computer to function as: a unit-specific waveform data acquisition unit that acquires unit-specific monitoring waveform data which is waveform data of at least one among total current consumption, a total input voltage, and total power consumption in a unit in which monitoring target electrical devices are installed; a first inference unit that infers operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and a second inference unit that infers the operation states of some of the monitoring target electrical devices based on a 2nd feature amount group including at least one kind of feature amount extracted from the unit-specific monitoring waveform data and different from the 1st feature amount group, and the training feature amount.

Advantageous Effects of Invention

According to the present invention, it is possible to reduce the number of training feature amounts (including sum training feature amounts) used to infer operation states of electrical devices.

BRIEF DESCRIPTION OF THE DRAWINGS

The above-described objects, other objects, features, and advantages will be apparent throughout preferred exemplary embodiments to be described below and the following drawings appended to the exemplary embodiments.

FIG. 3 is a diagram schematically illustrating an example of training data according to the present exemplary embodiment.

FIG. 4 is a diagram schematically illustrating an example of training data according to the present exemplary embodiment.

FIG. 5 is a diagram schematically illustrating an example of training data according to the present exemplary embodiment.

FIG. 7 is a diagram schematically illustrating an example of training data according to the present exemplary embodiment.

FIG. 10 is a diagram schematically illustrating an example of the training data according to the present exemplary embodiment.

FIG. 11 is a diagram schematically illustrating an example of information usable in order for a first inference unit to infer power states of monitoring target electrical devices.

FIG. 12 is a diagram schematically illustrating an example of training data according to the present exemplary embodiment.

FIG. 17 is a diagram schematically illustrating an example of an output example by an output unit according to the present exemplary embodiment.

DESCRIPTION OF EXEMPLARY EMBODIMENTS

Hereinafter, a hardware configuration of a device according to a present exemplary embodiment will be described. Each unit included in the device according to the present exemplary embodiment is constituted by any combination of hardware and software with a focus on a central processing unit (CPU), a memory, a program loaded on the memory (also including a program which is stored in the memory in advance when shipping out the device and a program which is downloaded from a storage medium such as a compact disc (CD), or a server or the like on the Internet) of any computer, a storage unit such as a hard disk which stores the program, and an interface for network connection. In addition, those skilled in the art can understand that various modifications can be made to examples for realizing the method and device.

Figure 1:
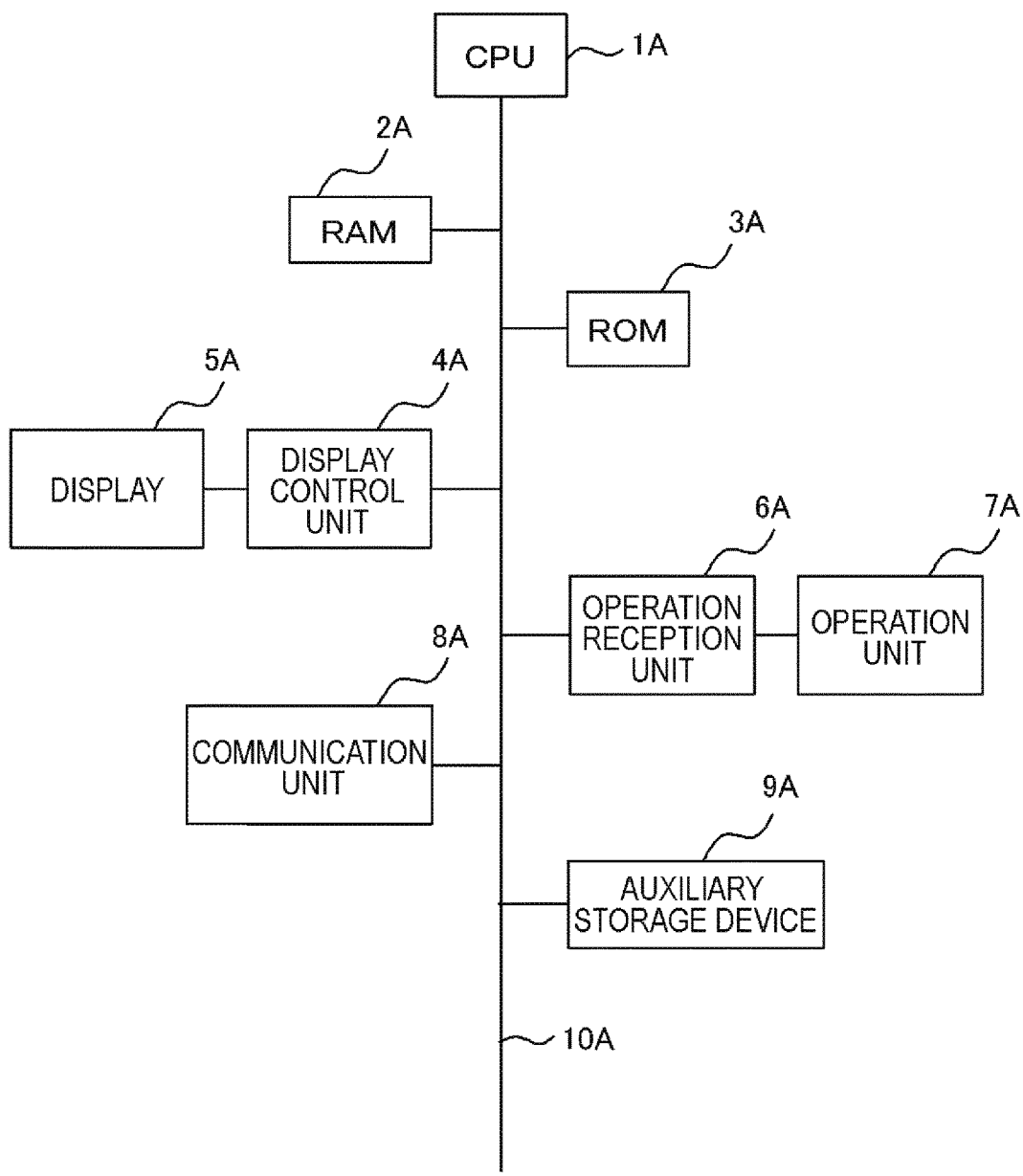
FIG. 1 is a diagram conceptually illustrating an example of a hardware configuration of a device according to a present exemplary embodiment.

FIG. 1 is a diagram conceptually illustrating an example of a hardware configuration of a device according to the present exemplary embodiment. As illustrated, the device according to the present exemplary embodiment includes, for example, a CPU 1A, a random access memory (RAM) 2A, a read-only memory (ROM) 3A, a display control unit 4A, a display 5A, an operation reception unit 6A, an operation unit 7A, a communication unit 8A, and an auxiliary storage device 9A connected to each other through a bus 10A. Although not illustrated, the device may additionally include other elements such as input and output interfaces connected to external devices in a wired manner, a microphone, and a speaker.

The CPU 1A controls each element and an entire computer of the device. The ROM 3A includes areas which store a program causing a computer to operate or various application program and various kinds of setting data used when such a program operates. The RAM 2A includes an area which temporarily stores data, such as a work area in which a program operate. The auxiliary storage device 9A is, for example, a hard disk drive (HDD) and can store large-volume data.

The display 5A is configured as, for example, a display device (for example, a light emitting diode (LED) display, a liquid crystal display, or an organic electroluminescence (EL) display). The display 5A may be a touch panel display integrated with a touch pad. The display control unit 4A reads data stored in a video RAM (VRAM), performs a predetermined process on the read data, and then transmits the data to the display 5A to display various screens. The operation reception unit 6A receives various operations through the operation unit 7A. The operation unit 7A includes an operation key, an operation button, a switch, a jog dial, a touch panel display, and a keyboard, and the like. The communication unit 8A is connected to a network such as the Internet or a local area network (LAN) in a wired and/or wireless manner to communicate with other electrical device.

Hereinafter, the present exemplary embodiment will be described. Functional block diagrams used to describe the following exemplary embodiments illustrate blocks in units of functions rather than configurations in units of hardware. In the drawings, each device is constituted by a single device in the description, but constitution methods are not limited thereto. That is, each device may, of course, have a physically divided configuration or a logically divided configuration. The same reference numerals are given to the same constituent elements and the description thereof will not be appropriately repeated.

<First Exemplary Embodiment>

First, an overview of a present exemplary embodiment will be described. In the exemplary embodiment, when monitoring waveform data (waveform data of at least one among total current consumption, a total input voltage, and total power consumption) acquired in a distribution board or the like is acquired, power states (a power-on state or a power-off state) of at least some of the plurality of monitoring target electrical devices are inferred using the waveform data (1st step).

In the 1st step, it is not necessary to infer even the power consumption of each monitoring target electrical device. It is sufficient that whether the power state of each monitoring target electrical device is the power-on state or the power-off state is inferred. Therefore, the number of combinations for preparing the sum training feature amounts is less than that in a case in which the power consumption of each monitoring target electrical device is inferred. As a result, it is possible to considerably reduce the number of training feature amounts (including the sum training feature amounts) to be used.

After the 1st step, the monitoring target electrical devices excluding the monitoring target electrical device of which the power state is inferred to be the power-off state are set as processing targets, and the power consumption of each of the monitoring target electrical devices which are the processing targets is inferred (2nd step).

In the 2nd step, the power consumption of each of the monitoring target electrical devices excluding the monitoring target electrical devices of which the power state is inferred to be the power-off state is inferred based on the training feature amounts corresponding to various kinds of power consumption of each of the monitoring target electrical devices which are the processing targets, and the sum training feature amounts generated by combining the training feature amounts.

According to the present exemplary embodiment, it is possible to reduce the number of monitoring target electrical devices which are the processing targets in the 2nd step in comparison with a case in which all of the monitoring target electrical devices are set as the processing targets in the 2nd step. Therefore, it is possible to reduce the number of combinations of the monitoring target electrical devices. As a result, it is possible to reduce the number of sum training feature amounts to be used.

The present inventors have confirmed that according to the present exemplary embodiment, a total number of training feature amounts (including the sum training feature amounts) used in the 1st step and the 2nd step can be considerably reduced in comparison with a case in which all of the monitoring target electrical devices are set as processing targets at one time to infer the power consumption.

Figure 2:
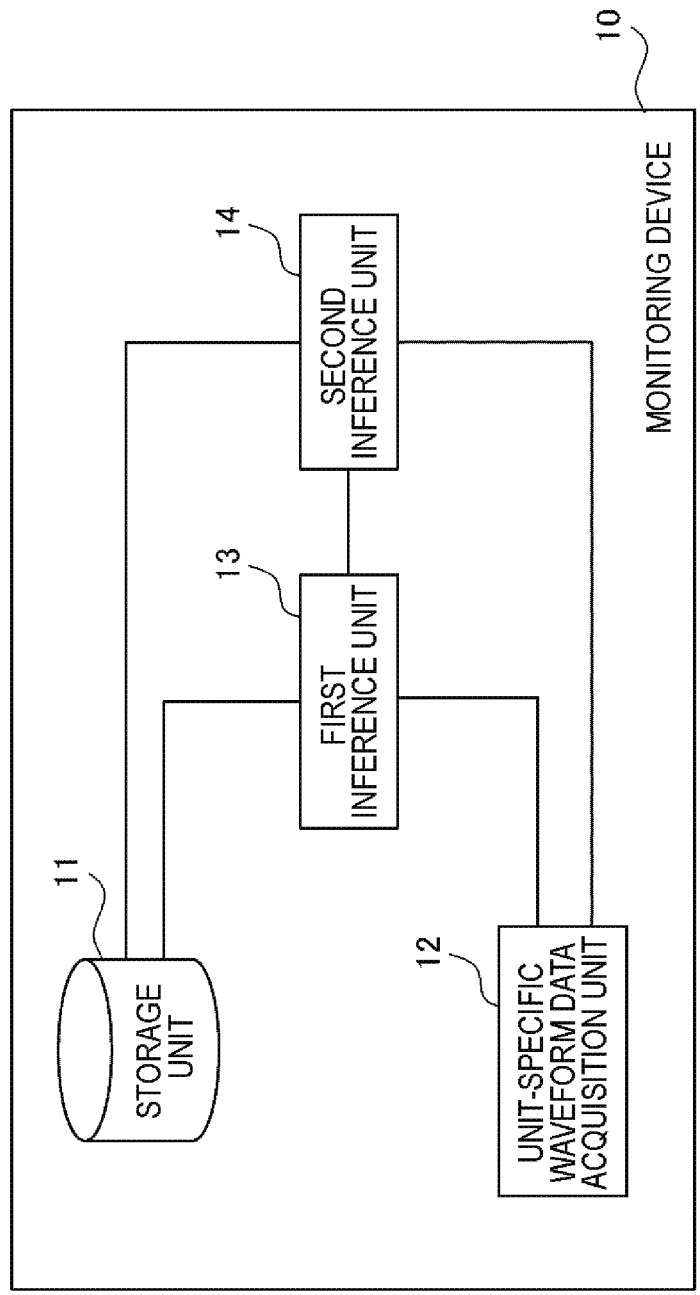
FIG. 2 is an exemplary functional block diagram illustrating a monitoring device according to the present exemplary embodiment.
Figure 21:
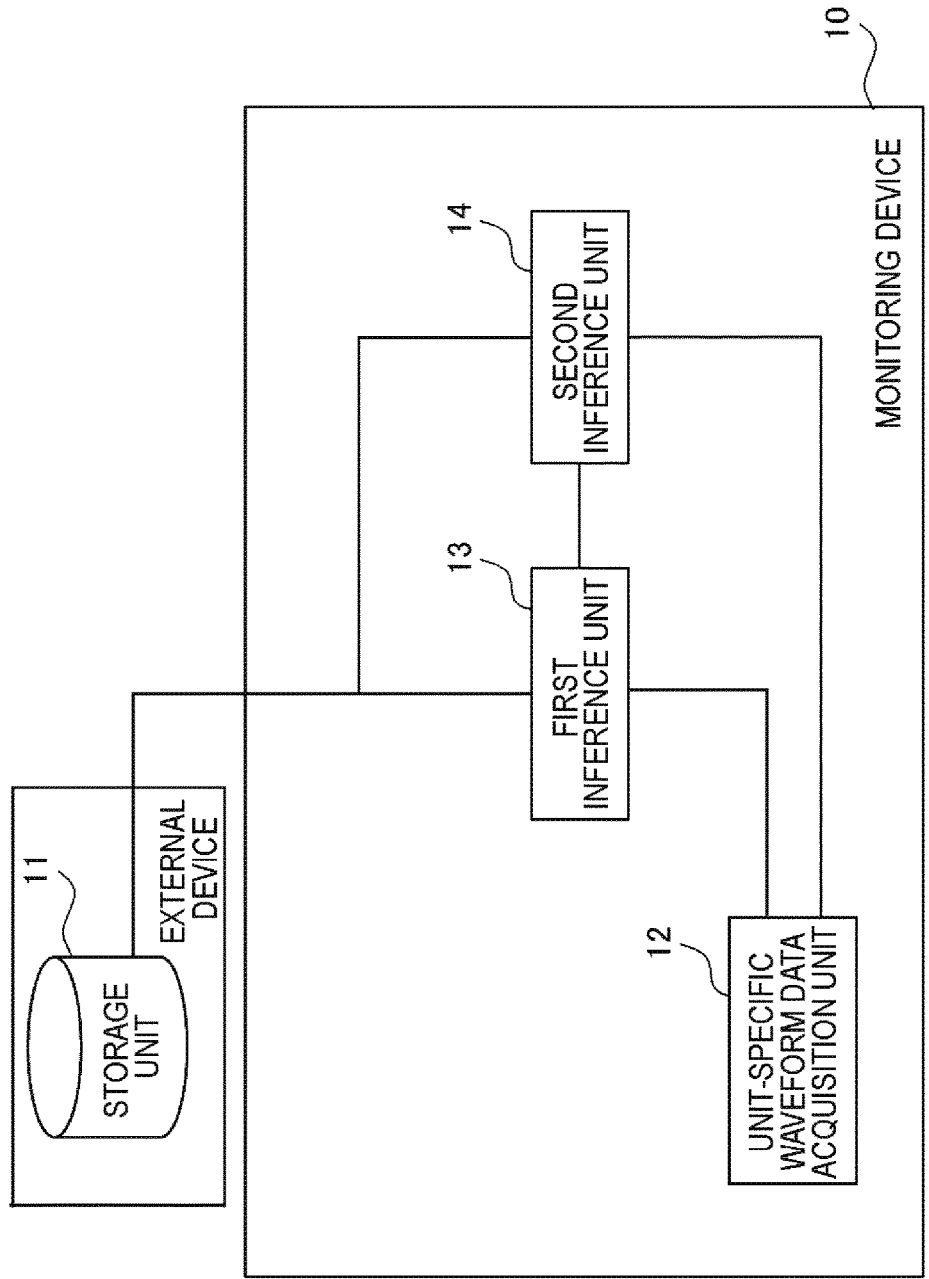
FIG. 21 is an exemplary functional block diagram illustrating the monitoring device according to the present exemplary embodiment.

Next, a configuration according to the present exemplary embodiment will be described in detail. FIG. 2 illustrates an exemplary functional block diagram illustrating the monitoring device 10 according to the present exemplary embodiment. As illustrated, the monitoring device 10 includes a storage unit 11, a unit-specific waveform data acquisition unit 12, a first inference unit 13, and a second inference unit 14. FIG. 21 illustrates another exemplary functional block diagram illustrating the monitoring device 10 according to the present exemplary embodiment. As illustrated, this example is different from the example of FIG. 2 in that the monitoring device 10 does not include the storage unit 11. In this case, the storage unit 11 is provided in a device different from the monitoring device 10. The monitoring device 10 communicates with the device in a wired and/or wireless manner and acquires information stored in the storage unit 11.

The storage unit 11 stores training data in which at least one of the following (1) and (2) is associated with each monitoring target electrical device.

(1) Device-specific training waveform data which is waveform data at least one among the current consumption, the input voltage, and the power consumption of each monitoring target electrical device.

(2) At least one kind of training feature amount extracted from the device-specific training waveform data of (1).

The training feature amounts are feature amounts unique to predetermined operation states (for example, a power-on state, a state in which power of a predetermined value is consumed, and a state in which a power state is changed (from ON to OFF or from OFF to ON)) of each monitoring target electrical device. The storage unit 11 can store the training feature amounts in association with various operation states for each monitoring target electrical device.

The training feature amount may be, for example, a frequency intensity/phase (harmonic component) of current consumption, a phase, change in current consumption, an average value, a peak value, an effective value, a peak-to-rms ratio, a form factor, a convergence time of a current change, an energization time, the position of a peak, a time difference between a peak position of a voltage and a peak position of current consumption, a power factor, a component with a specific frequency (½ period, ⅓ period, or the like), or a change amount thereof. Of course, the training feature amount is not limited to these examples.

The predetermined operation states of each monitoring target electrical device may be expressed as one kind of feature amount or a combination of a plurality of kinds of feature amounts. Each operation state may be expressed as a combination of the same kind of feature amount or may be expressed as a combination of different kinds of feature amounts.

FIG. 3 schematically illustrates examples of the training data stored in the storage unit 11. In the training data illustrated in FIG. 3, the training feature amount at the time of the power-on state of each monitoring target electrical device is associated with each monitoring target electrical device. In this case, the training feature amount is a feature amount extracted from the waveform data (for example, waveform data corresponding to a predetermined period) at the time of the power-on state. In the training data illustrated in FIG. 3, a device ID, a training data ID, the training feature amount, and a state are associated with each other.

FIG. 4 schematically illustrates examples of other training data stored in the storage unit 11. In the training data illustrated in FIG. 4, the training feature amount at the time of change in each power state is associated with each monitoring target electrical device. The training feature amount in this case is, for example, a feature amount extracted from the waveform data of a difference between the waveform data (for example, waveform data corresponding to the predetermined period) at the time of the power-on state and the waveform data (for example, waveform data corresponding to the predetermined period) at the time of the power-off state, or a difference between the feature amount extracted from the waveform data at the time of the power-on state and the feature amount extracted from the waveform data at the time of the power-off state. In the training data illustrated in FIG. 4, a device ID, a training data ID, a training feature amount, and a state are associated with each other.

FIG. 5 schematically illustrates examples of other training data stored in the storage unit 11. In the training data illustrated in FIG. 5, the training feature amount at the time of each power consumption is associated with each monitoring target electrical device. The training feature amount in this case is a feature amount extracted from the waveform data (for example, the waveform data corresponding to the predetermined period) at the time of each power consumption. In the training data illustrated in FIG. 5, a device ID, a training data ID, a power value band, a representative value, the training feature amount, and a state are associated with each other.

An overview of the training data in FIG. 5 will be described with reference to FIG. 6. In the case of the training data, a range from 0 W to the rated power is divided into arbitrary groups with a predetermined power value width for each monitoring target electrical device. The power value width of each group and the number of groups may be decided for each monitoring target electrical device. The representative value and the training feature amount are generated for each group.

Figure 6:
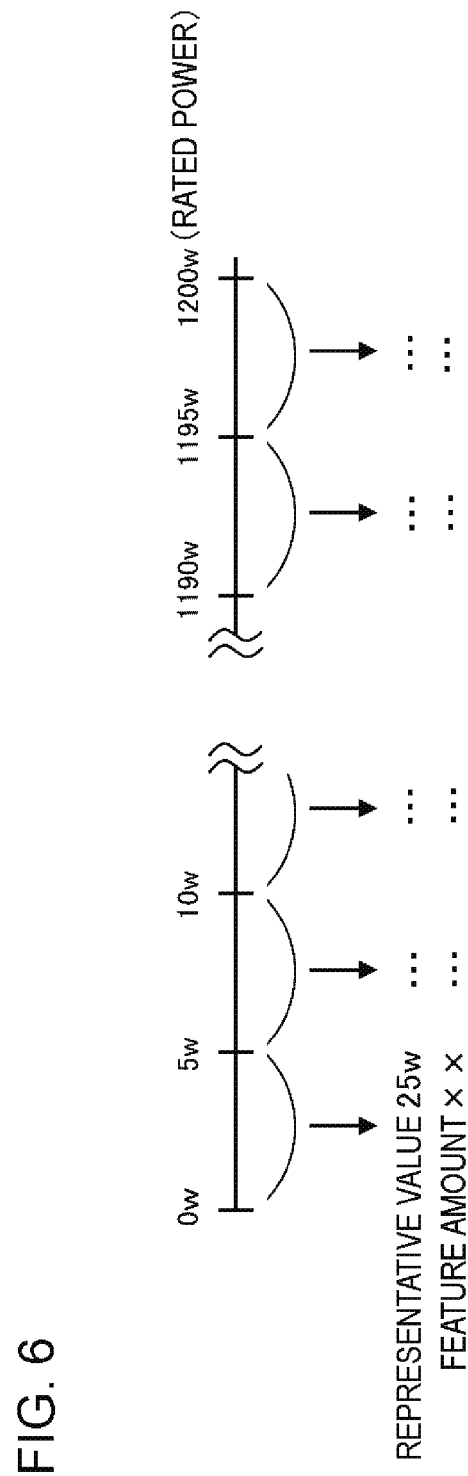
FIG. 6 is a diagram illustrating the training data illustrated in FIG. 5.

In the case of the example illustrated in FIG. 6, the range from 0 W to 1200 W (rated power) is divided into a plurality of groups with a power value width of 5 W. A statistical value (an average value, a maximum value, a minimum value, a median value, power consumption with highest rate of occurrence, or the like) of the power value band included in each group is set as a representative value. A feature amount extracted from the waveform data (for example, the waveform data corresponding to the predetermined period) at the time of consumption of one power in the power value band included in each group is set as a training feature amount.

Each training data ID illustrated in FIG. 5 corresponds to each of the above-described groups and the power value band indicates the power value band included in each group.

FIG. 7 schematically illustrates examples of other training data stored in the storage unit 11. In the training data illustrated in FIG. 7, the training feature amount at the time of each power consumption is associated with each monitoring target electrical device. The training feature amount in this case is a feature amount extracted from the waveform data (for example, the waveform data corresponding to the predetermined period) at the time of each power consumption. In the training data illustrated in FIG. 7, a device ID, a training data ID, a power value band, a representative value, a training feature amount, and a state are associated with each other.

An overview of the training data in FIG. 7 will be described with reference to FIGS. 8 and 9. In the case of the training data, groups in which the representative value and the training feature amount are generated are partially set within a range from 0 W to the rated power for each monitoring target electrical device. The power value width of each group and the number of groups may be decided for each monitoring target electrical device. The representative value and the training feature amount are generated for each group.

Figure 8:
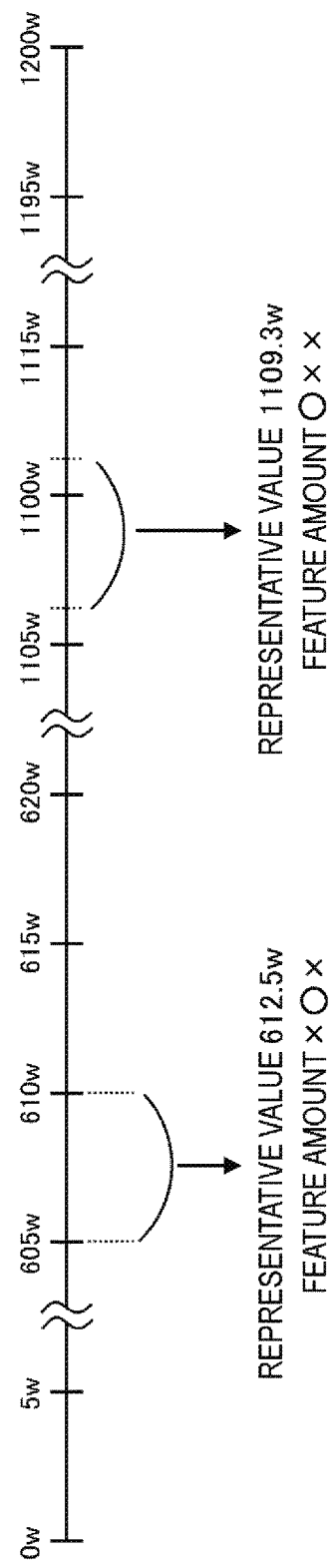
FIG. 8 is a diagram illustrating the training data illustrated in FIG. 7.
Figure 9:
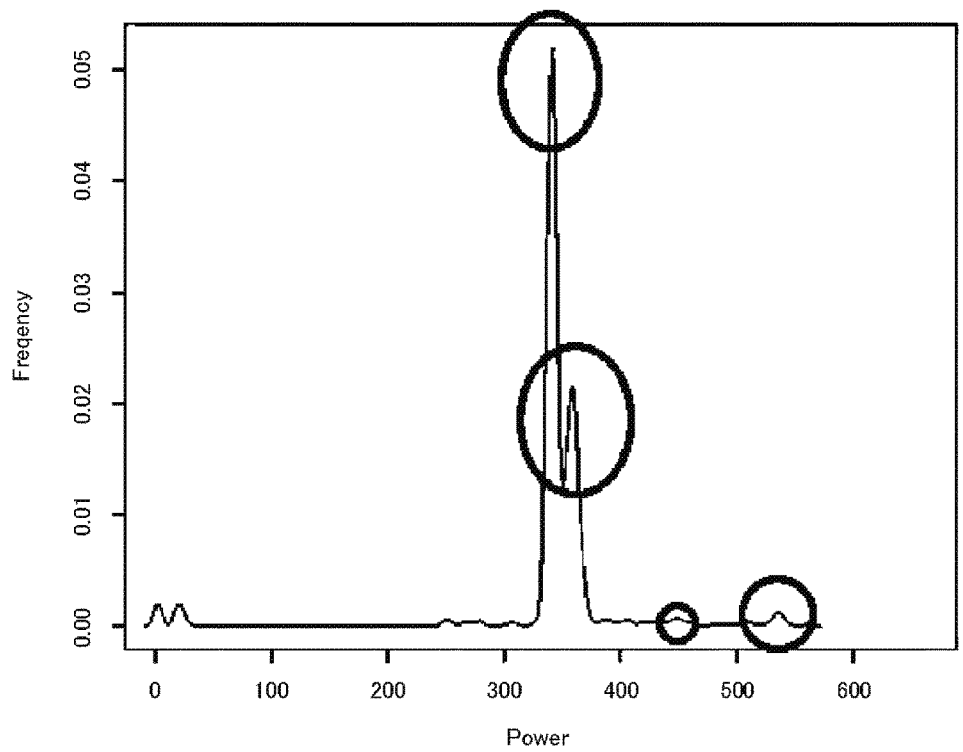
FIG. 9 is a diagram illustrating the training data illustrated in FIG. 7.

In the case of the example illustrated in FIG. 8, for example, the groups are set from 605 W to 610 W and from 1107 W to 1112 W. A statistical value (an average value, a maximum value, a minimum value, a median value, power consumption of highest rate of occurrence, or the like) of the power value band included in each group is set as a representative value. A feature amount extracted from the waveform data (for example, the waveform data corresponding to the predetermined period) at the time of consumption of one power in the power value band included in each group is set as a training feature amount.

Here, an example in which the groups in which the representative value and the training feature amount are generated are partially set within the range from 0 W to the rated power will be described. For example, for each monitoring target electrical device, the frequency analysis of the power consumption is performed using the device-specific training waveform data corresponding to a predetermined time. As a method for the frequency analysis, for example, a method of generating a frequency distribution curve and analyzing the frequency distribution curve, a method of generating a histogram and analyzing the histogram, or a method of dividing a power consumption band (greater than 0 W and equal or less than the rated power) which the processing target electrical devices can actually consume into a plurality of groups and counting the consumption power of each group is considered. However, the present invention is not limited thereto.

The generation of the frequency distribution curve may be achieved, for example, by performing kernel density estimation. In this case, for example, a Gaussian kernel can be used in a kernel function and the band width of Silverman can be used in a band width. Another kernel function (for example, a polynomial) or another band width can also be used. FIG. 9 illustrates an example of the generated frequency distribution curve. The horizontal axis represents power consumption and the vertical axis represents the rate of occurrence.

Further, the group may be set so that a power value with relatively high rate of occurrence is included therein. A low power consumption band (for example, equal to or less than 10 percentages of the rated power) may be excluded from a group setting target.

For example, the storage unit 11 may store at least some of the training data including the training feature amounts exemplified herein. The storage unit 11 may store the device-specific training waveform data instead of the training data including the training feature amounts exemplified herein. In this case, the first inference unit 13 and the second inference unit 14 to be described below generate the training data exemplified herein at a predetermined timing using the device-specific training waveform data stored in the storage unit 11.

Referring back to FIG. 2, the unit-specific waveform data acquisition unit 12 acquires unit-specific monitoring waveform data which is waveform data of at least one among total current consumption, a total input voltage, and total power consumption in a unit (a household, a branch unit of a distribution board, a company, one floor of one building, or the like) in which the monitoring target electrical devices are installed. The unit-specific monitoring waveform data may be acquired through, for example, a measuring instrument installed near a power trunk line portion such as a distribution board.

The unit-specific waveform data acquisition unit 12 may acquire the unit-specific monitoring waveform data through a real-time process or may acquire the unit-specific monitoring waveform data corresponding to a predetermined time (for example, 1 minutes, 30 minutes, 1 hour, or 24 hours) collectively through a batch process. In a case in which power consumption (instantaneous value) of the monitoring target electrical device is supplied to a user in real time, the unit-specific waveform data acquisition unit 12 acquires the unit-specific monitoring waveform data through the real-time process.

The first inference unit 13 infers operation states of at least some of the monitoring target electrical devices based on a 1st feature amount group including at least one kind of feature amount extracted from the unit-specific monitoring waveform data acquired by the unit-specific waveform data acquisition unit 12, and the training feature amounts (including the sum training feature amounts) extracted from the device-specific training waveform data. In the case of the present exemplary embodiment, the first inference unit 13 infers whether the operation states of at least some of the monitoring target electrical devices are the power-on state or the power-off state.

For example, the first inference unit 13 may generate an inference model using the training data (see FIGS. 3, 4, and 10) in which the training feature amounts (including the sum training feature amounts) and the state (the power state or the change in the power state) are associated and may obtain an inference result (a power state, change in the power state, or the like of each monitoring target electrical device) by inputting values (feature amounts) of the 1st feature amount group into the generated inference model. The 1st feature amount group is configured to include the same kind of feature amount as the training feature amount (including the sum training feature amount) used to generate the inference model used by the first inference unit 13. In the inference model, for example, multiple regression analysis, a neural network, or a genetic algorithm can be used.

For example, the first inference unit 13 infers the power states of at least some of the monitoring target electrical devices based on the training data (see FIG. 3) in which the training feature amount at the time of the power-on state of each of the monitoring target electrical devices is associated with each of the monitoring target electrical devices, and the training data (see FIG. 10) including the sum training feature amount generated by combining the training data of each of the monitoring target electrical device.

In the training data illustrated in FIG. 10, the training data ID, the training feature amount, and the state are associated with each other. The training data corresponds to each of the combinations of all of the plurality of monitoring target electrical devices. That is, in a case in which the number of monitoring target electrical devices is M, the training data corresponds to all of the combinations in a case in which M monitoring target electrical devices are extracted from M monitoring target electrical devices, the combinations in which (M−1) monitoring target electrical device are extracted from M monitoring target electrical devices, . . . and two monitoring target electrical devices are extracted from M monitoring target electrical devices. The storage unit 11 may store such training data including the sum training feature amounts in advance. The first inference unit 13 may generate training data including the sum training feature amounts of a predetermined timing using the device-specific training waveform data or the training feature amounts corresponding to each of the monitoring target electrical devices stored in the storage unit 11.

As another example, the first inference unit 13 may infer the power states of at least some of the monitoring target electrical devices based on the training data (see FIG. 4) which is stored in the storage unit 11 and in which the training feature amount at the time of the change of the power state of each of the monitoring target electrical devices is associated with each of the monitoring target electrical devices. In the case of this example, the first inference unit 13 normally manages the power states of the monitoring target electrical devices (see FIG. 11). When the change in the power states of at least some of the monitoring target electrical devices is detected based on the training data (see FIG. 4) in which the training feature amounts at the time of the change in the power states are associated, and the sum training feature amounts thereof (not illustrated), the managed information (see FIG. 11) is updated. The first inference unit 13 can specify the power state of each monitoring target electrical device at a certain time point with reference to the information.

In a case in which the storage unit 11 stores the device-specific training waveform data and does not store the training feature amount, the first inference unit 13 extracts the training feature amount using the device-specific training waveform data, generates the sum training feature amounts using the extracted training feature amounts, and infers the power states of at least some of the monitoring target electrical devices based on the feature amounts (including the sum training feature amounts).

Referring back to FIG. 2, the second inference unit 14 infers the operation states of some of the monitoring target electrical devices based on a 2nd feature amount group including at least one kind of feature amount extracted from the unit-specific monitoring waveform data and different from the 1st feature amount group, and the training feature amounts extracted from the device-specific training waveform data. In the case of the present exemplary embodiment, the second inference unit 14 infers the power consumption of at least some of the monitoring target electrical devices excluding the monitoring target electrical devices of which the power state is inferred to the power-off state by the first inference unit 13.

For example, the second inference unit 14 may generate an inference model using the training data (see FIGS. 5, 7, and 12) in which the training feature amounts (including the sum training feature amounts) and the state (the power consumption) are associated and may obtain an inference result (the power consumption of each of the monitoring target electrical devices) by inputting values (feature amounts) of the 2nd feature amount group into the generated inference model. The 2nd feature amount group is configured to include the same kind of feature amount as the training feature amount (including the sum training feature amount) used to generate the inference model used by the second inference unit 14. In the inference model, for example, multiple regression analysis, a neural network, or a genetic algorithm can be used.

In the training data illustrated in FIG. 12, the training data ID, the training feature amount, and the state are associated with each other. The training data corresponds to each of all the combinations of the plurality of monitoring target electrical devices. The combinations of the plurality of monitoring target electrical devices are further subdivided according to the plurality of operation states (power consumption) of the monitoring target electrical devices. For example, a combination of a first monitoring target electrical device and a second monitoring target electrical device is considered. For simplicity, the first monitoring target electrical device is assumed to have two operation states, power consumption of 2.5 W and 5 W, and the second monitoring target electrical device is assumed to have three operation states, 1 W, 2 W, and 3 W. In this case, the combination (first: second) of the first monitoring target electrical device and the second monitoring target electrical device is subdivided into 6 combinations, (2.5 W: 1 W), (2.5 W: 2 W), (2.5 W: 3 W), (5 W: 1 W), (5 W: 2 W), and (5 W: 3 W). The training data illustrated in FIG. 12 corresponds to each of the subdivided combinations. The storage unit 11 may store the training data in advance. The second inference unit 14 may generate training data at a predetermined timing using the device-specific training waveform data or the training feature amounts corresponding to each of the monitoring target electrical devices stored in the storage unit 11.

In a case in which the storage unit 11 stores the device-specific training waveform data and does not store the training feature amounts, the second inference unit 14 extracts the training feature amounts using the device-specific training waveform data, generates the sum training feature amounts using the extracted training feature amounts and infers the power consumption of at least some of the monitoring target electrical devices based on the feature amounts (including the sum training feature amounts).

Figure 13:
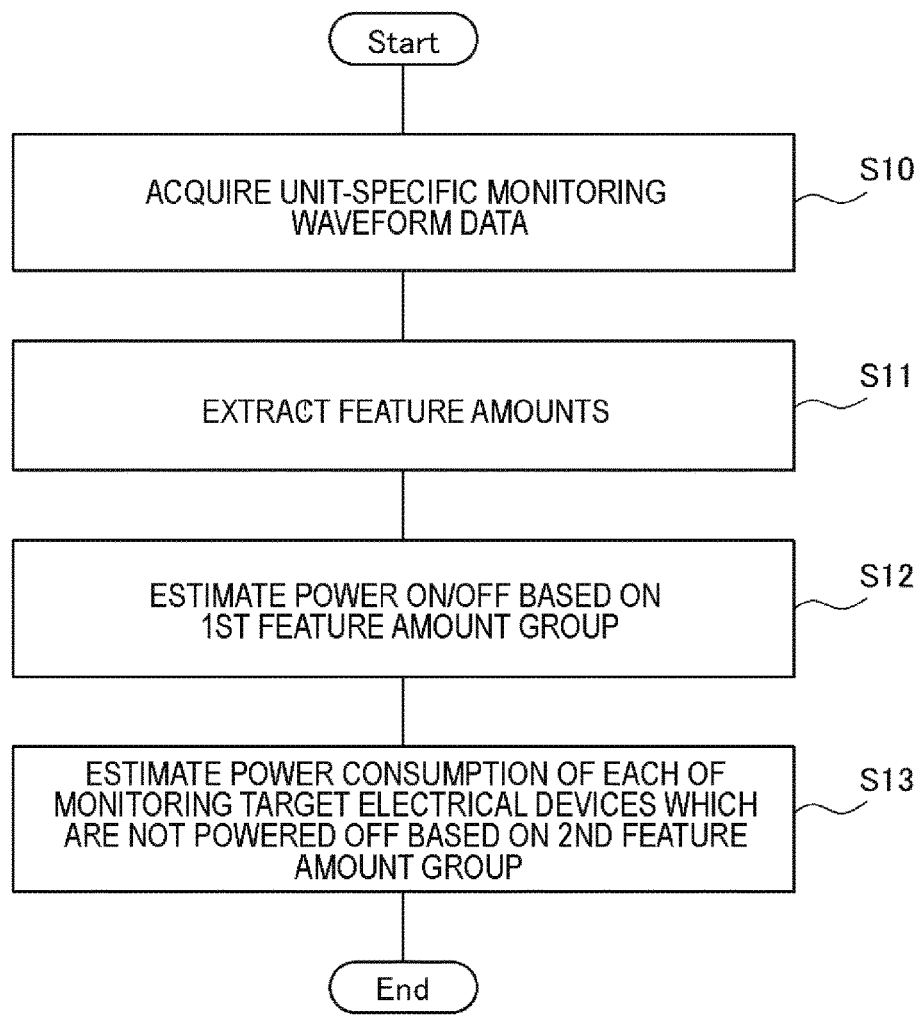
FIG. 13 is a flowchart illustrating an example of the flow of a process of the monitoring device according to the present exemplary embodiment.

Next, an example of the flow of a process of a monitoring method according to the present exemplary embodiment will be described with reference to the flowchart of FIG. 13.

The unit-specific waveform data acquisition unit 12 first acquires the unit-specific monitoring waveform data which is waveform data of at least one among the total current consumption, the total input voltage, and the total power consumption in the unit in which the monitoring target electrical devices are installed (S10).

For example, the unit-specific waveform data acquisition unit 12 acquires the unit-specific monitoring waveform data from the measuring instrument installed in the predetermined unit through the real-time process. In this case, the unit-specific waveform data acquisition unit 12 continues to acquire the unit-specific monitoring waveform data. Alternatively, the unit-specific waveform data acquisition unit 12 collectively acquires the unit-specific monitoring waveform data corresponding to the predetermined time through the batch process.

A "case of the real-time process" to be described below refers to a case in which the process of S11 is the real-time process and a "case of the batch process" refers to a case in which the process of S11 is the batch process.

Subsequently, the monitoring device 10 extracts a predetermined kind of feature amount from the waveform data corresponding to the predetermined period (corresponding to a processing target) in the unit-specific monitoring waveform data acquired in S10 (S11).

In the real-time process, the monitoring device 10 extracts the predetermined kind of feature amount from the recent waveform data corresponding to the predetermined period. Then, the predetermined kind of feature amount extracted from the recent waveform data corresponding to the predetermined period are input to the first inference unit 13 and the second inference unit 14.

On the other hand, in the case of the batch process, the monitoring device 10 sets a plurality of pieces of waveform data corresponding to the predetermined period (corresponding to the processing targets) included in the unit-specific monitoring waveform data corresponding to the predetermined time as processing targets in order and extracts the predetermined kind of feature amount from the processing target waveform data corresponding to the predetermined period. Whenever the predetermined kind of feature amount is extracted from one piece of waveform data corresponding to the predetermined period or whenever the predetermined kind of feature amount is extracted from a predetermined number of pieces of waveform data corresponding to the predetermined period, the monitoring device 10 inputs the predetermined kind of extracted feature amount to the first inference unit 13 and the second inference unit 14.

Thereafter, the first inference unit 13 infers the operation states (power states) of at least some of the monitoring target electrical devices based on the 1st feature amount group among the feature amounts extracted in S11, and the training feature amounts stored in the storage unit 11 or the training feature amounts extracted from the device-specific training waveform data stored in the storage unit 11 (S12).

For example, when the predetermined kind of feature amount (the 1st feature amount group) extracted in S11 is acquired, the first inference unit 13 acquires the training data (see FIG. 3 or the like) including the training feature amounts in the power-on state and the training data (see FIG. 10 or the like) including the sum training feature amounts generated using the training data including the training feature amounts from the storage unit 11. In a case in which the storage unit 11 does not store the training data (see FIG. 10 or the like) including the sum training feature amounts, the first inference unit 13 generates the training data (see FIG. 10 or the like) including the sum training feature amounts using the training data (see FIG. 3 or the like) acquired from the storage unit 11 and including the training feature amounts in the power-on states. In a case in which the storage unit 11 stores the device-specific training waveform data and does not store the training data (see FIG. 3 or the like) including the training feature amounts in the power-on state, the first inference unit 13 acquires the device-specific training waveform data and generates the training data (see FIG. 3 or the like) including the training feature amounts in the power-on state using the device-specific training waveform data. The training data (see FIG. 10 or the like) including the sum training feature amounts is generated using the training data (see FIG. 3 or the like) including the generated training feature amounts in the power-on state.

Then, the first inference unit 13 generates the inference model using the acquired training data (see FIG. 3 or the like) including the training feature amounts in the power-on state and the training data (see FIG. 10 or the like) including the sum training feature amounts generated using the training data including the training feature amounts and obtains the inference result by inputting the values (the feature amounts) of the 1st feature amount group into the generated inference model. The monitoring target electrical devices which are the processing targets of the first inference unit 13 are decided in advance. Therefore, the inference model may be generated in advance and stored in the storage unit 11. The first inference unit 13 may take out the inference model from the storage unit 11 and perform the inference process.

The first inference unit 13 may infer the power states of the monitoring target electrical devices at a certain time point by constantly managing the power states of the monitoring target electrical devices (see FIG. 11), detecting the change in the power states of the monitoring target electrical devices using the feature amounts extracted from the unit-specific monitoring waveform data, and updating the management information (see FIG. 11).

In the real-time process, the first inference unit 13 infers the power states based on the predetermined kind of feature amount (the 1st feature amount group) extracted from the latest waveform data corresponding of the predetermined period and thereafter inputs the inference result to the second inference unit 14. In the case of the batch process, on the other hand, whenever the first inference unit 13 infers the power state based on the predetermined kind of feature amount (the 1st feature amount group) extracted from one piece of waveform data corresponding to the predetermined period or whenever the inference unit 13 performs the inference based on the predetermined kind of feature amount (the 1st feature amount group) extracted from the predetermined number of pieces of waveform data corresponding to the predetermined period, the monitoring device 10 inputs the inference result to the second inference unit 14.

Thereafter, the second inference unit 14 infers the operation states (power consumption) of the monitoring target electrical devices excluding the monitoring target electrical device of which the power state is inferred to be power-off state in S12. Specifically, the operation states (power consumption) of predetermined monitoring target electrical devices are inferred based on the 2nd feature amount group among the feature amounts extracted in S11, and the training feature amounts stored in the storage unit 11 or the training feature amounts extracted from the device-specific training waveform data stored in the storage unit 11 (S13).

For example, when the predetermined kind of feature amount (the 2nd feature amount group) extracted in S11 and the inference result (the power states) are acquired in S12, the second inference unit 14 acquires the training data (see FIG. 5 or the like) including the training feature amounts corresponding to each power consumption of the monitoring target electrical devices of which the power state is not inferred to be the power-off state in S11 and the training data (see FIG. 12 or the like) including the sum training feature amounts generated using the training data including the training feature amounts from the storage unit 11. In a case in which the storage unit 11 does not store the training data (see FIG. 12 or the like) including the sum training feature amounts, the second inference unit 14 generates the training data (see FIG. 12 or the like) including the sum training feature amounts using the training data (see FIG. 5 or the like) acquired from the storage unit 11 and including the training feature amounts corresponding to each power consumption of each of the monitoring target electrical devices of which the power state is not inferred to be the power-off state. In a case in which the storage unit 11 stores the device-specific training waveform data and does not store the training data (see FIG. 5 or the like) including the training feature amounts corresponding to each power consumption, the second inference unit 14 acquires the device-specific training waveform data of the monitoring target electrical devices of which the power state is not inferred to be the power-off state in S11 from the storage unit 11 and generates the training data (see FIG. 5 or the like) including the training feature amounts corresponding to each power consumption using the device-specific training waveform data. The training data (see FIG. 12 or the like) including the sum training feature amounts is generated using the training data (see FIG. 5 or the like) including the generated training feature amounts corresponding to each power consumption.

Then, the second inference unit 14 generates the inference model using the acquired training data (see FIG. 5 or the like) including the training feature amounts corresponding to each power consumption of the monitoring target electrical devices of which the power state is not inferred to be the power-off state and the training data (see FIG. 12 or the like) including the sum training feature amounts generated using the training data including the training feature amounts and obtains the inference result by inputting the values (the feature amounts) of the 2nd feature amount group into the generated inference model. In the case of the present exemplary embodiment, the monitoring target electrical devices which are the processing targets of the second inference unit 14 are not specified in advance and are decided through the inference process of S12. Therefore, the inference model may not be generated in advance.

In the case of the real-time process, through the foregoing processes, the power consumption of each monitoring target electrical device is inferred at a certain time point (latest time point). The foregoing processes are repeated. In the case of the batch process, on the other hand, the change in the power consumption of each monitoring target electrical device within a certain time (a time of the unit-specific monitoring waveform data acquired in S11) is inferred through the foregoing processes. The power consumption of the monitoring target electrical device of which the power state is inferred to be the power-off state is inferred to be, for example, 0 W.

According to the above-described present exemplary embodiment, before the power consumption of each of the monitoring target electrical devices is inferred based on the training feature amounts corresponding to various types of power consumption of the monitoring target electrical devices and the sum training feature amounts generated by combining the training feature amounts, the power state of each of the monitoring target electrical devices is inferred based on the training feature amounts corresponding to the power state of each of the monitoring target electrical devices and the sum training feature amounts generated by combining the training feature amounts. Then, the power consumption of each of the monitoring target electrical devices is inferred based on the training feature amounts corresponding to each power consumption of each of the monitoring target electrical devices excluding the monitoring target electrical device of which the power state is inferred to be the power-off state (inferred to be, for example, 0 W) and the sum training feature amount generated by combining the training feature amounts.

In the inference of the power state of each of the monitoring target electrical devices, the number of used training feature amounts (including the sum training feature mounts) is considerably less than in the case of the inference of the power consumption of each of the monitoring target electrical devices.

In the case of the present exemplary embodiment, the monitoring target electrical devices of which the power state is inferred to be the power-off sate (the power consumption is inferred to be, for example, 0 W) can be excluded from the processing targets. Therefore, the number of training feature amounts (including the sum training feature amounts) used in the process of inferring the power consumption of each of the monitoring target electrical devices can be considerably reduced more than in a case in which all of the monitoring target electrical devices are set as the processing targets and the power consumption of each of the monitoring target electrical devices is inferred.

The present inventors have confirmed that a total number of training feature amounts (including the sum training feature amounts) used to infer the operation state (the power state or the power consumption) of each of the monitoring target electrical devices can be considerably reduced in comparison with a case in which all of the monitoring target electrical devices are set as the processing targets and the power consumption of each of the monitoring target electrical device is inferred according to the present exemplary embodiment.

According to the present exemplary embodiment, there are realized the advantageous effects of reducing a processing load on the process of generating the inference model using the training data as well as reducing a generation workload of the training feature amounts (including the sum training feature amounts).

Here, an application example of the monitoring device 10 according to the present exemplary embodiment will be described with reference to FIGS. 14 and 15. The application example is the same in all of the following exemplary embodiments.

Figure 14:
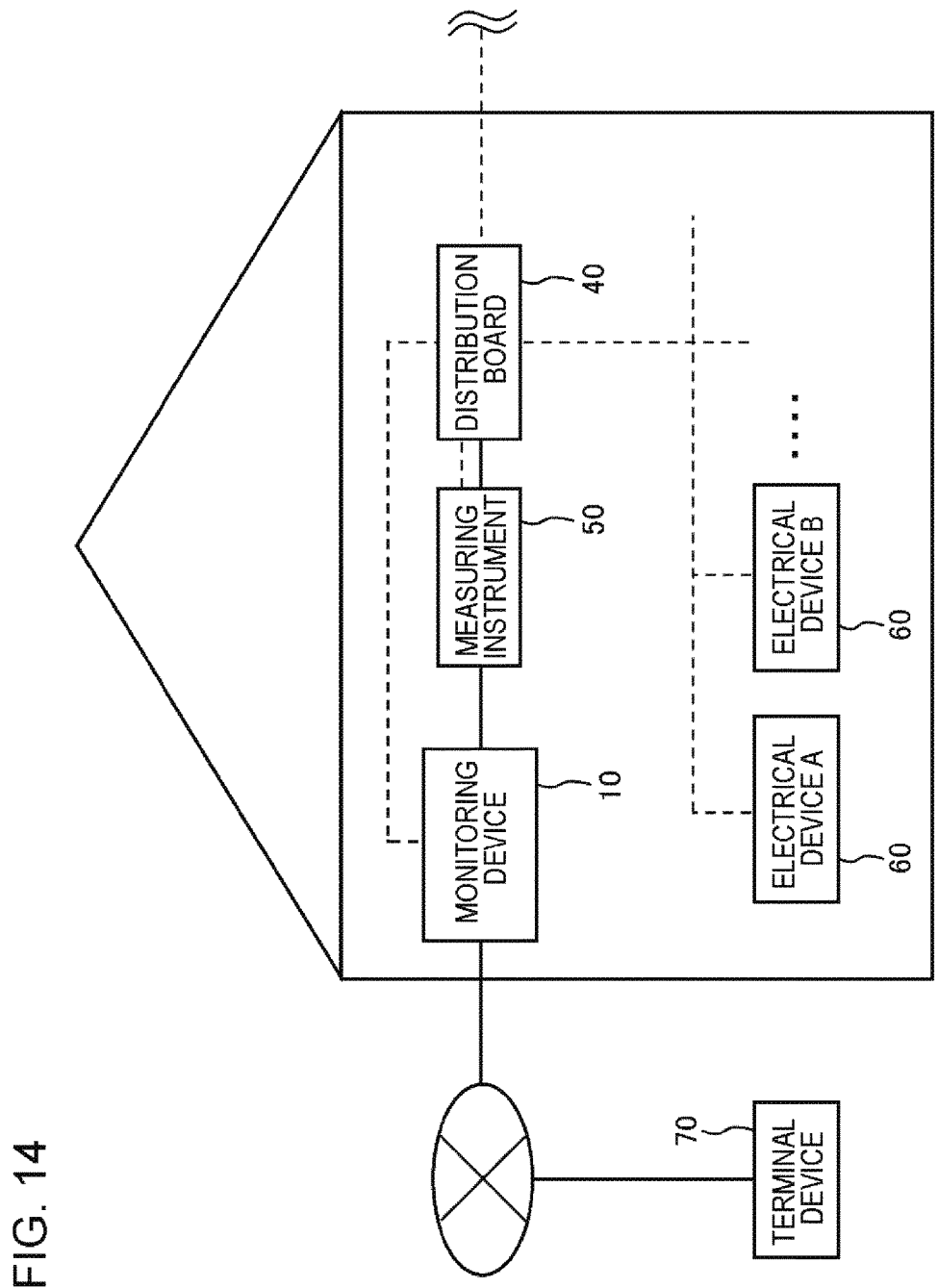
FIG. 14 is a diagram schematically illustrating an example of an application example of the monitoring device according to the present exemplary embodiment.

In the application example illustrated in FIG. 14, the monitoring device 10 is installed in a predetermined unit such as a household, a company, or a building. In the unit, a plurality of electrical devices 60 are installed. Power is supplied to each electrical device 60 through a distribution board 40 installed in the unit. In the drawing, the flow of the power is indicated by a dotted line. The flow of data is indicated by a solid line.

A measuring instrument 50 is installed beside the distribution board 40 to measure current consumption, an input voltage, power consumption, and the like. Measurement data measured by the measuring instrument 50 is transmitted to the monitoring device 10. The monitoring device 10, the distribution board 40, and the measuring instrument 50 are in a state in which data communication is possible through a LAN or a dedicated cable linking the plurality of devices. The monitoring device 10 is connected to a terminal device 70 owned by a user through a network 30 such as the Internet. The electrical device 60 and the monitoring device 10 may be in the state in which data communication with each other is possible although not connected by a data communication line in the drawing. For example, the electrical device 60 may have a function of being connected to a network such as a LAN. The monitoring device 10 supplies the user with the inference result through an output device of the monitoring device 10 or the terminal device 70.

In the case of the application example, predetermined data is stored in the storage unit 11 in the following preliminary preparation.

For example, after the monitoring device 10 is installed in a predetermined unit, the electrical device 60 is individually operated. At this time, the monitoring device 10 receives an input of information identifying the operated electrical device 60 from, for example, the user and acquires each piece of measurement data measured by the measuring instrument 50 as device-specific training waveform data of each monitoring target electrical device. The monitoring device 10 can store the acquired device-specific training waveform data of each monitoring target electrical device in the storage unit 11. The monitoring device 10 may extract a predetermined training feature amount from each piece of acquired device-specific training waveform data of each monitoring target electrical device and store the extracted training feature amount in association with each monitoring target electrical device in the storage unit 11. Further, the monitoring device 10 may generate the sum training feature amount using the training feature amounts corresponding to each monitoring target electrical device and store the generated sum training feature amount in the storage unit 11.

As another example, device-specific training waveform data of each of various diverse electrical devices available in markets or a predetermined training feature amount extracted from the device-specific training waveform data may be stored in a server (not illustrated) connected to the network 30. The monitoring device 10 acquires information identifying each of the electrical devices 60 installed in the predetermined unit through an input by hand operation of the monitoring device 10, an input through the terminal device 70, or communication with each of the electrical devices 60. Thereafter, the monitoring device 10 may access the server, acquire the device-specific training waveform data or the training feature amount of each of the identified electrical devices 60, and store the device-specific training waveform data or the training feature amount in the storage unit 11. In a case in which the device-specific training waveform data is acquired from the server, the monitoring device 10 may extract a predetermined feature amount from the device-specific training waveform data and store the device-specific training waveform data in the storage unit 11. Further, the monitoring device 10 may generate the sum training feature amounts using the training feature amounts corresponding to each of the monitoring target electrical devices and store the generated sum training feature amounts in the storage unit 11.

The foregoing two examples may be combined as an example. That is, when the monitoring device 10 acquires the information identifying each of the electrical devices 60 installed in the predetermined unit, the monitoring device 10 accesses the server, acquires the device-specific training waveform data or the training feature amount of each of the identified electrical devices 60, and stores the device-specific training waveform data or the training feature amount in the storage unit 11. In a case in which the device-specific training waveform data is acquired from the server, the monitoring device 10 may extract a predetermined feature amount from the data and store the predetermined feature amount in the storage unit 11. Then, in a case in which the device-specific training waveform data or the training feature amount of each of one or more electrical devices 60 may not be acquired through the foregoing process for the reason that the device-specific training waveform data or the training feature amount is not stored in the server, or the like, the monitoring device 10 may output information prompting a job of individually operating the unacquirable electrical devices 60 to the user. Then, the monitoring device 10 may acquire the device-specific training waveform data or the training feature amount as in the above-described unit where the electrical devices 60 are individually operated. Even in this case, the monitoring device 10 may generate the sum training feature amounts using the training feature amounts corresponding to each of the monitoring target electrical device and store the generated sum training feature amounts in the storage unit 11.

Through the foregoing preliminary preparation, the above-described inference process is performed by the unit-specific waveform data acquisition unit 12, the first inference unit 13, and the second inference unit 14 after the predetermined data is stored in the storage unit 11.

Figure 15:
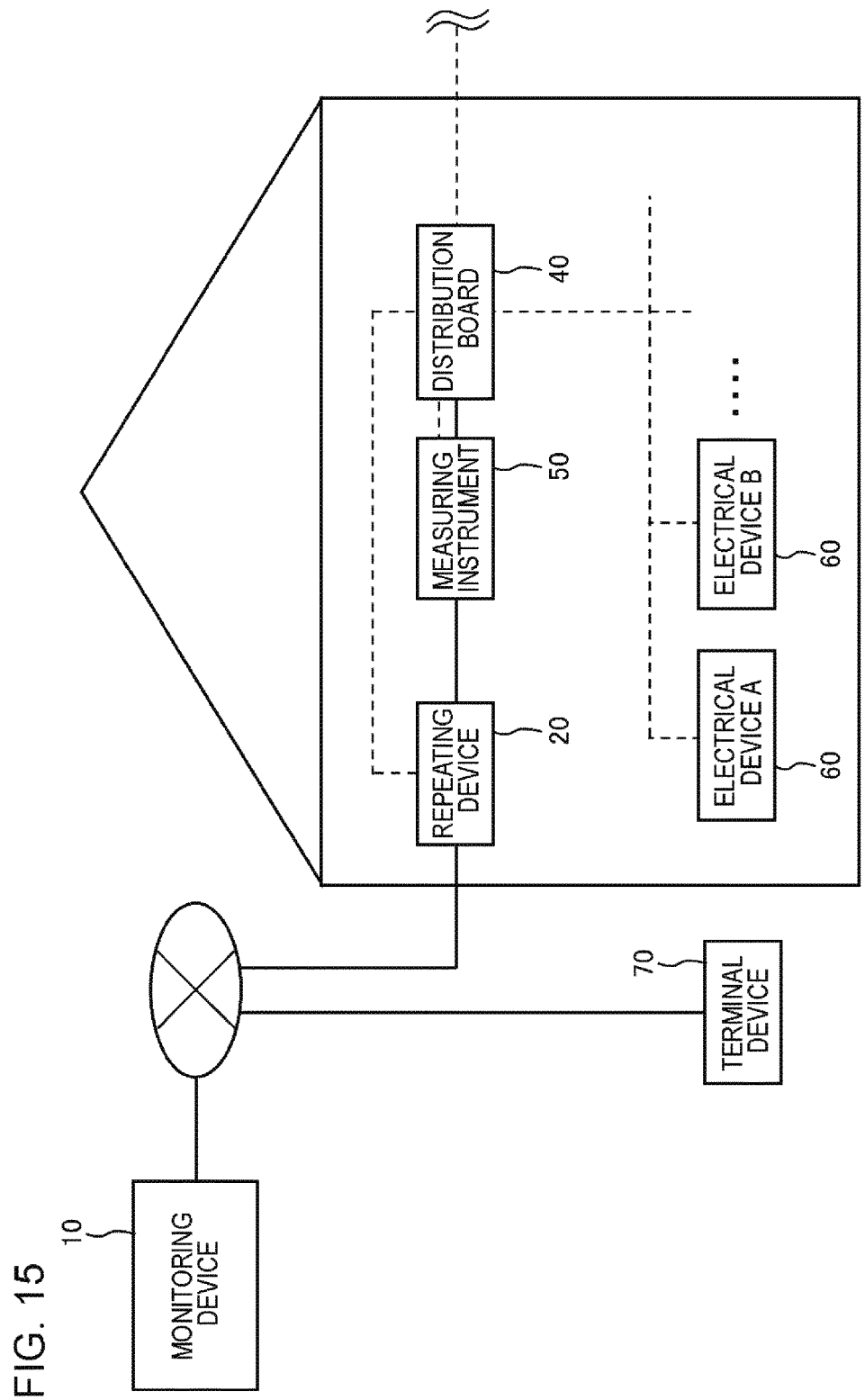
FIG. 15 is a diagram schematically illustrating an example of an application example of the monitoring device according to the present exemplary embodiment.

In the application example illustrated in FIG. 15, a repeating device 20 is installed in a predetermined unit such as a household, a company, or a building. In the unit, a plurality of electrical devices 60 are installed. Power is supplied to each electrical device 60 through a distribution board 40 installed in the unit. In the drawing, the flow of the power is indicated by a dotted line. The flow of data is indicated by a solid line.

A measuring instrument 50 is installed beside the distribution board 40 to measure current consumption, an input voltage, power consumption, and the like. Measurement data measured by the measuring instrument 50 is transmitted to the repeating device 20. The repeating device 20, the distribution board 40, and the measuring instrument 50 are in a state in which data communication is possible through a LAN or a dedicated cable linking the plurality of devices. The repeating device 20 is connected to a terminal device 70 owned by a user through a network 30 such as the Internet. The electrical device 60 and the repeating device 20 may be in the state in which data communication with each other is possible although not connected by a data communication line in the drawing. For example, the electrical device 60 may have a function of being connected to a network such as a LAN.

The monitoring device 10 is installed outside the predetermined unit. The monitoring device 10 may be a so-called cloud server. The monitoring device 10 can perform data communication with the repeating device 20 or the terminal device 70 through a network 30. For example, the monitoring device 10 acquires unit-specific monitoring waveform data through the repeating device 20. The monitoring device 10 supplies the user with the inference result through the repeating device 20 or the terminal device 70.

In the case of the application example, when the repeating device 20 acquires measurement data (the device-specific training waveform data, the unit-specific monitoring waveform data, or the like) from the measuring instrument 50, the repeating device 20 transmits the acquired measurement data to the monitoring device 10. The repeating device 20 can receive an input of information identifying the electrical device 60 corresponding to each piece of measurement data for generating training data from the user, for example, in the same way as the example illustrated in FIG. 14 and also transmit the identification information of the electrical device 60 corresponding to the piece of measurement data for generating training data along with the piece of measurement data for generating training data to the monitoring device 10. When the repeating device 20 acquires data (the information identifying the electrical devices 60 installed in the unit, or the like) from the electrical devices 60 installed in the predetermined unit, the repeating device 20 transmits the acquired data to monitoring device 10. When the repeating device 20 receives an input of predetermined information (the information identifying the electrical devices 60 installed in the unit, or the like) from the user, the repeating device 20 transmits the acquired information to monitoring device 10. Even in the application example, predetermined data is stored in the storage unit 11 in the same preprocessing as the application example illustrated in FIG. 14.

<Second Exemplary Embodiment>

Figure 16:
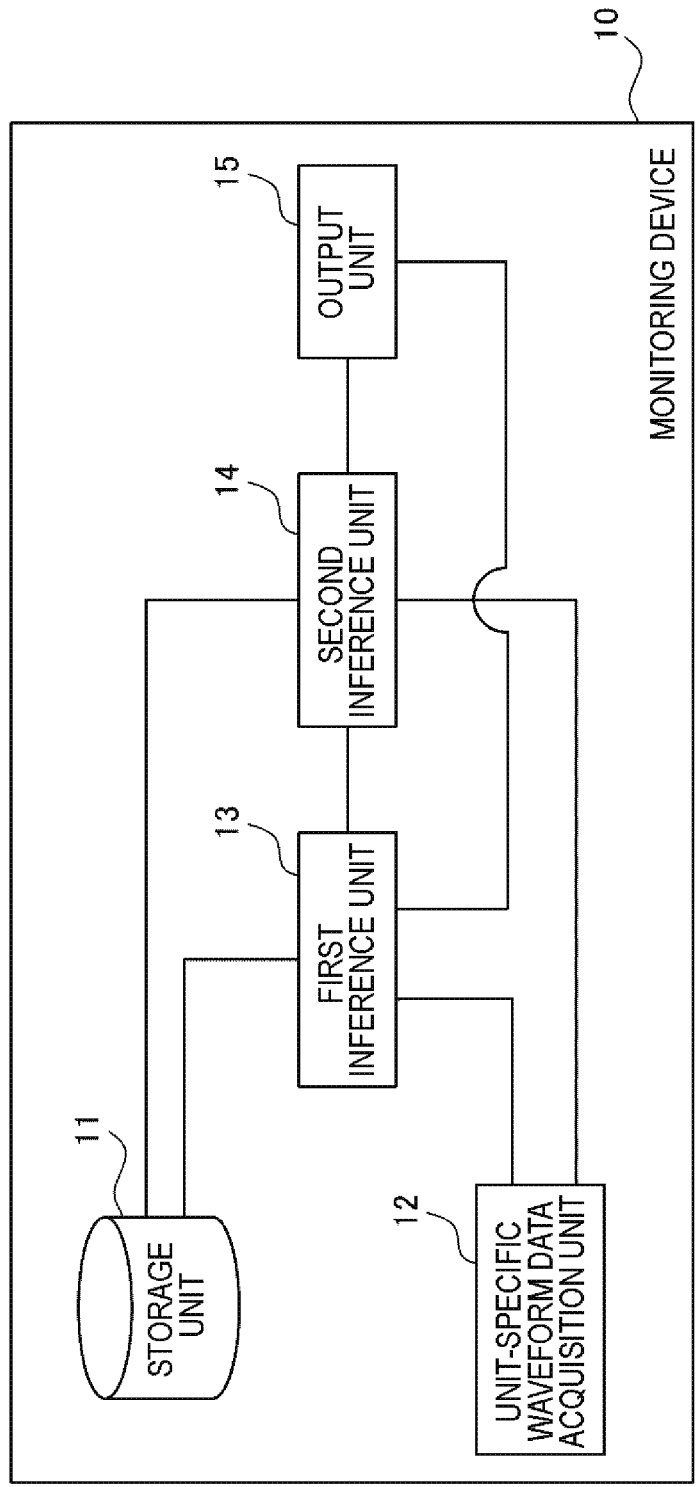
FIG. 16 is an exemplary functional block diagram illustrating the monitoring device according to the present exemplary embodiment.

The present exemplary embodiment is different from the first exemplary embodiment in that an output unit 15 is included. FIG. 16 illustrates an exemplary functional block diagram illustrating a monitoring device 10 according to the present exemplary embodiment. As illustrated, the monitoring device 10 includes a storage unit 11, a unit-specific waveform data acquisition unit 12, a first inference unit 13, a second inference unit 14, and an output unit 15. The configurations of the storage unit 11, the unit-specific waveform data acquisition unit 12, the first inference unit 13, and the second inference unit 14 are the same as those of the first exemplary embodiment. The monitoring device according to the present exemplary embodiment may also be configured not to include the storage unit 11, as in the first exemplary embodiment (see FIG. 21).

The output unit 15 outputs inference results (the power consumption (an instantaneous value or a history of the power consumption in a predetermined period) of each monitoring target electrical device) by the first inference unit 13 and the second inference unit 14. The output unit 15 may output the inference results through an output device such as a display, a printer, or a mailer. In a case in which the mailer is used, address information of a destination to which the inference results are transmitted is registered in advance in the output unit 15. Then, the output unit 15 transmits the inference results to a predetermined transmission destination using predetermined address information.

FIG. 17 illustrates an example of an output example. According to the inference result illustrated in FIG. 17, a user can easily comprehend total power consumption (instantaneous value) at a certain time point in a certain unit and the current consumption (instantaneous value) of each of the monitoring target electrical devices installed in the unit.

According to the present exemplary embodiment, it is possible to realize the other same advantageous effects as those of the first exemplary embodiment.

<Third Exemplary Embodiment>

In the present exemplary embodiment, the power consumption of each of some of the monitoring target electrical devices is inferred using the 1st feature amount group (1st step), and subsequently the power consumption of at least some of the monitoring target electrical devices of which the power consumption is not inferred in the 1st step is inferred using the 2nd feature amount group (2nd step).

The present inventors have found that some of various feature amounts extracted from the unit-specific monitoring waveform data are unique to specific monitoring target electrical devices. That is, some of the feature amounts extracted from the unit-specific monitoring waveform data include only components of some of the monitoring target electrical devices and does not include components of the other monitoring target electrical devices.

In the present exemplary embodiment, the power consumption of each of some of the monitoring target electrical devices is inferred using the feature amounts unique to some of the monitoring target electrical devices (1st step), and subsequently the power consumption of each of the other monitoring target electrical devices is inferred (2nd step). Since the power consumption of each of some of the monitoring target electrical devices is inferred in the 1st step, the power consumption of the other remaining monitoring target electrical devices is inferred in consideration of the power consumption of each of some of the monitoring target electrical devices inferred in the 1st step (for example, by subtracting the power consumption of that extent) in the 2nd step.

In the case of the present exemplary embodiment, in the 1st step, the power consumption of each of some of the monitoring target electrical devices can be inferred using only the training feature amounts and the sum training feature amounts of some of the monitoring target electrical devices. Since the feature amounts treated in the 1st step do not include the components of the other monitoring target electrical devices, it is not necessary to set the other monitoring target electrical devices as the processing targets in the step.

In the 2nd step, the power consumption of each of the other monitoring target electrical devices may be inferred using only the training feature amounts and the sum training feature amounts of the other monitoring target electrical devices excluding the monitoring target electrical devices which are the processing targets in the 1st step.

For example, in a case in which the number of monitoring target electrical devices is 5, the number of combinations is 31 ($=_5C_5+_5C_4+_5C_3+_5C_2+_5C_1$). On the other hand, in a case in which 5 monitoring target electrical devices are divided into a group of 3 monitoring target electrical devices and a group of 2 monitoring target electrical devices, the number of combinations of the groups is 7 ($=_3C_3+_3C_2+_3C_1$) and 3 ($=_2C_2+_2C_1$), and a total number is 10. In the latter case, since it is not necessary to consider combinations of the monitoring target electrical devices included in the first group and the monitoring target electrical devices included in the second group, the total number of combinations is reduced by a number of combinations not required to be considered.

According to the exemplary embodiment, it is possible to reduce the number of training feature amounts (including the sum training feature amounts) used to infer the power consumption of each of the monitoring target electrical devices.

An exemplary functional block diagram of the monitoring device 10 according to the present exemplary embodiment is the same as FIGS. 2, 16, and 21. The configurations of the storage unit 11, the unit-specific waveform data acquisition unit 12, and the output unit 15 are the same as those of the first and second exemplary embodiments.

The first inference unit 13 infers the power consumption of each of some of the monitoring target electrical devices based on the 1st feature amount group including at least one kind of feature amount extracted from the unit-specific monitoring waveform data.

As described above, some of various feature amounts extracted from the unit-specific monitoring waveform data are unique to specific monitoring target electrical devices. The first inference unit 13 infers the power consumption of each of some of the monitoring target electrical devices based on the feature amounts (the 1st feature amount group) unique to some of the monitoring target electrical devices.

Figure 18:
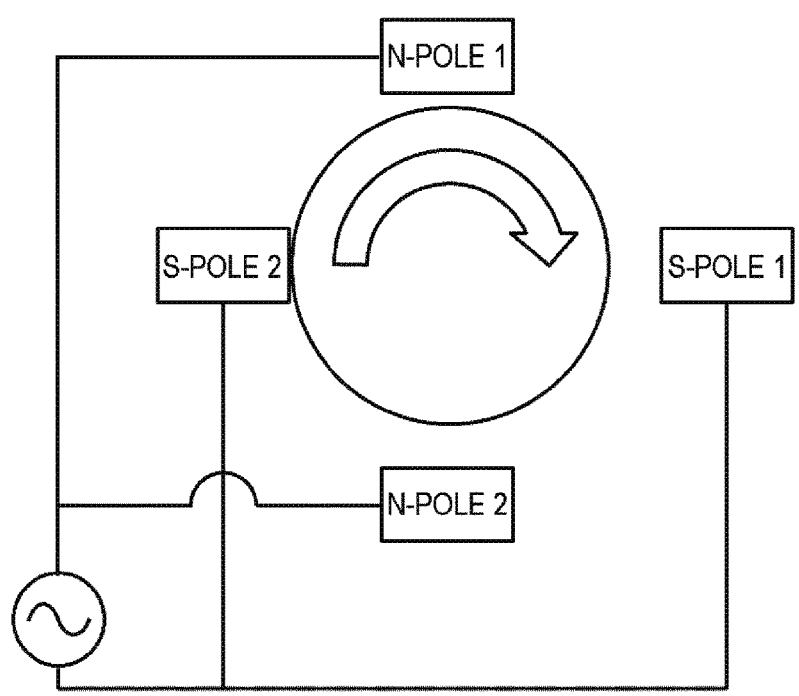
FIG. 18 is a diagram illustrating an example of a monitoring target electrical device of which power consumption is inferred by a first inference unit.

For example, a monitoring target electrical device including a single phase motor that has the n-pole corresponds to such a monitoring target electrical device. FIG. 18 illustrates an example of a motor that has 4 poles. In the case of the motor, ½ rotations is performed at one period. In a case of a monitor that has 6 poles, ⅓ rotations is performed at one period.

In the motor, in a case in which there is a difference between characteristics (speed, force, and the like) at the time of ½ rotation and characteristics (speed, force, and the like) at the time of remaining ½ rotation, a component of a frequency (25 Hz in the case of Eastern Japan and 30 Hz in the case of Western Japan) corresponding to ½ period occurs in the waveform data. In the case of the other monitoring target electrical devices, the component does not occur in the waveform data. Therefore, in the case of the example, the feature amount originated from the component of the frequency (25 Hz in the case of Eastern Japan and 30 Hz in the case of Western Japan) corresponding to ½ period can be set as the 1st feature amount group.

The 1st feature amount group is unique to some of the monitoring target electrical devices and the other monitoring target electrical devices do not have the feature amounts. That is, the kind of feature amount extracted from the unit-specific monitoring waveform data does not include the components of the other monitoring target electrical devices. Therefore, the first inference unit 13 can infer the power consumption of each of some of the monitoring target electrical devices based on the training feature amounts of some of the monitoring target electrical devices and the sum training feature amounts obtained by summing the training feature amounts.

The first inference unit 13 may infer the power consumption of each of some of the monitoring target electrical devices based on some (1st-1st feature amount group) among the 1st feature amount group and may infer the power consumption of each of other some of the monitoring target electrical devices based on the others (1st-2nd feature amount group) of the 1st feature amount group. For example, the 1st-1st feature amount group is the feature amounts originated from the components of the frequency (25 Hz in the case of Eastern Japan and 30 Hz in the case of Western Japan) corresponding to ½ period and the 1st-2nd feature amount group is the feature amounts originated from the components of the frequency (about 17 Hz in the case of Eastern Japan and 20 Hz in the case of Western Japan) corresponding to ⅓ period. Here, the example in which the 1st feature amount group is divided into two groups has been described, but may be divided into more groups.

The second inference unit 14 infers the power consumption of at least some of the monitoring target electrical devices excluding the monitoring target electrical devices of which the power consumption is inferred by the first inference unit 13 (which are the processing targets) based on the 2nd feature amount group. The feature amounts included in the 2nd feature amount group may also include the components of the monitoring target electrical devices of which the power consumption is inferred by the first inference unit 13. Accordingly, the second inference unit 14 infers the power consumption of each of the other monitoring target electrical devices through a process in which the unit-specific monitoring waveform data is considered to include the components. The components mean components appearing in the unit-specific monitoring waveform data when the monitoring target electrical devices of which the power consumption is inferred by the first inference unit 13 consume inferred power.

As the process in which the unit-specific monitoring waveform data is considered to include the components, for example, a process of subtracting the components from the unit-specific monitoring waveform data and a process of subtracting the feature amounts corresponding to the components from the feature amounts extracted from the unit-specific monitoring waveform data are considered. However, the present invention is not limited thereto. The other remaining configuration of the second inference unit 14 is the same as that of the first and second exemplary embodiments.

In the case of the present exemplary embodiment, the first inference unit 13 and the second inference unit 14 infer the power consumption of each of the monitoring target electrical devices based on the training feature amounts indicating that the power consumption of the monitoring target electrical device is a predetermined value.

Figure 19:
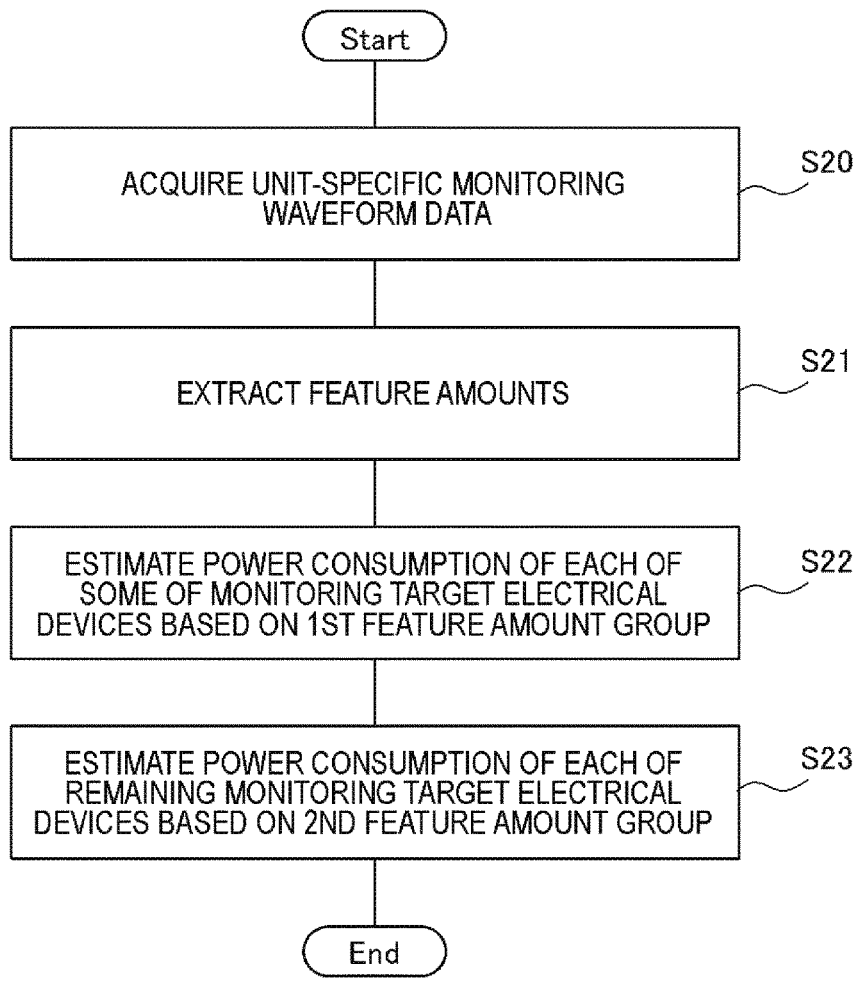
FIG. 19 is a flowchart illustrating an example of the flow of a process of the monitoring device according to the present exemplary embodiment.

Next, an example of the flow of a process of a monitoring method according to the present exemplary embodiment will be described with reference to the flowchart of FIG. 19. The following process may be either the real-time process or the batch process. In either case, the flow is the same as that described in the first exemplary embodiment.

The unit-specific waveform data acquisition unit 12 first acquires the unit-specific monitoring waveform data which is waveform data of at least one among the total current consumption, the total input voltage, and the total power consumption in the unit in which the monitoring target electrical devices are installed (S20).

Subsequently, the monitoring device 10 extracts predetermined kind of feature amount from the unit-specific monitoring waveform data acquired in S20 (S21).

Thereafter, the first inference unit 13 infers the operation states (power consumption) of at least some of the monitoring target electrical devices based on the 1st feature amount group among the feature amounts extracted in S21, and the training feature amounts stored in the storage unit 11 or the training feature amounts extracted from the device-specific training waveform data stored in the storage unit 11 (S22).

For example, when the predetermined kind of feature amount (the 1st feature amount group) extracted in S21 is acquired, the first inference unit 13 acquires the training data including the training feature amounts including the predetermined kind of feature amount corresponding to each power consumption of each of some predetermined monitoring target electrical devices and the training data including the sum training feature amounts generated using the training data including the training feature amounts from the storage unit 11. In a case in which the storage unit 11 does not store the training data including the sum training feature amounts, the first inference unit 13 generates the training data including the sum training feature amounts using the training data acquired from the storage unit 11 and including the training feature amounts corresponding to each power consumption of each of the some predetermined monitoring target electrical devices. In a case in which the storage unit 11 stores the device-specific training waveform data and does not store the training data corresponding to each power consumption, the first inference unit 13 acquires the device-specific training waveform data of the some predetermined monitoring target electrical devices from the storage unit 11 and generates the training data including the training feature amounts including the predetermined kind of feature amount corresponding to each power consumption using the device-specific training waveform data. The training data including the sum training feature amounts is generated using the training data including the generated training feature amounts corresponding to each power consumption.

Then, the first inference unit 13 generates the inference model using the acquired training data including the training feature amounts including the predetermined kind of feature amount corresponding to each power consumption of each of the some predetermined monitoring target electrical devices and the training data including the sum training feature amounts generated using the training data including the training feature amounts and obtains the inference result by inputting the values (the feature amounts) of the 1st feature amount group into the generated inference model. The monitoring target electrical devices which are the processing targets of the first inference unit 13 are decided in advance. Therefore, the inference model may be generated in advance and stored in the storage unit 11. The first inference unit 13 may take out the inference model from the storage unit 11 and perform the inference process.

Thereafter, the second inference unit 14 infers the operation states (power consumption) of the monitoring target electrical devices excluding the monitoring target electrical devices of which the power consumption is inferred in S22 (which are the processing targets) (S23).

For example, when the predetermined kind of feature amount (the 2nd feature amount group) extracted in S21 and the inference result (power consumption) of S22 are acquired, the second inference unit 14 acquires the training data including the training feature amounts corresponding to each power consumption of each of the monitoring target electrical devices of which the power consumption is not inferred in S22 and the training data including the sum training feature amounts generated using the training data including the training feature amounts from the storage unit 11. In a case in which the storage unit 11 does not store the training data including the sum training feature amounts, the second inference unit 14 generates the training data including the sum training feature amounts using the training data acquired from the storage unit 11 and corresponding to each power consumption of each of some of the monitoring target electrical devices. In a case in which the storage unit 11 stores the device-specific training waveform data and does not store the training data including the training feature amounts corresponding to each power consumption, the second inference unit 14 acquires the device-specific training waveform data of the monitoring target electrical devices of which the power consumption is not inferred in S22 from the storage unit 11 and generates the training data including the training feature amounts corresponding to each power consumption using the device-specific training waveform data. The training data including the sum training feature amounts is generated using the training data including the training feature amounts corresponding to each power consumption.

Then, the second inference unit 14 generates the inference model using the acquired training data including the training feature amounts corresponding to each power consumption of each of some of the monitoring target electrical devices and the training data including the sum training feature amounts generated using the training data including the training feature amounts and obtains the inference result by inputting the values (the feature amounts) of the 2nd feature amount group into the generated inference model. In the case of the present exemplary embodiment, the monitoring target electrical devices which are the processing targets of the second inference unit 14 are decided in advance. Therefore, the inference model may be generated in advance and stored in the storage unit 11. The second inference unit 14 may take out the inference model from the storage unit 11 and perform the inference process. Through the foregoing processes, the power consumption of each of the monitoring target electrical devices is inferred.

According to the present exemplary embodiment, it is possible to realize the same operational effects as those of the first and second exemplary embodiments.

<Fourth Exemplary Embodiment>

In the present exemplary embodiment, a process of inferring the power states of some of the monitoring target electrical devices using the 1st feature amount group (1st step) and a process of inferring the power consumption of each of other some of the monitoring target electrical devices using a 1'st feature amount group (1'st step) are performed, and subsequently the power consumption of each of the other monitoring target electrical devices excluding the monitoring target electrical devices of which the power state is inferred to be the power-off state in the 1st step and the monitoring target electrical device of which the power consumption is inferred in the 1'st step is inferred using the 2nd feature amount group (2nd step).

An exemplary functional block diagram of the monitoring device 10 according to the present exemplary embodiment is the same as FIGS. 2, 16, and 21. The configurations of the storage unit 11, the unit-specific waveform data acquisition unit 12, and the output unit 15 are the same as those of the first to third exemplary embodiments.

The first inference unit 13 infers the power states of some of the monitoring target electrical devices using the 1st feature amount group. This process has been described in the first exemplary embodiment. The first inference unit 13 infers the power consumption of each of other some of the monitoring target electrical devices using the 1'st feature amount group different from the 1st feature amount group. This process has been described in the third exemplary embodiment.

The sequence of the process of inferring the power states and the process of inferring the power consumption by the first inference unit 13 is not particularly limited, but any one of the processes may be first performed. In a case in which the process of inferring the power states is first performed, the monitoring target electrical devices of which the power state is inferred to be the power-off state through this process can be excluded from targets of the process of inferring the power consumption. In a case in which the process of inferring the power consumption is first performed, the monitoring target electrical devices of which the power consumption is inferred through this process can be excluded from targets of the process of inferring the power states. In either case, the subsequent process can be performed in consideration of the result of the previous process.

The second inference unit 14 infers the power consumption of at least some of the monitoring target electrical devices excluding the monitoring target electrical devices of which the power consumption is inferred by the first inference unit 13 and the monitoring target electrical devices of which the power state is inferred to be the power-off state by the first inference unit 13. The other remaining configuration of the second inference unit 14 is the same as that of the first to third exemplary embodiments.

Figure 20:
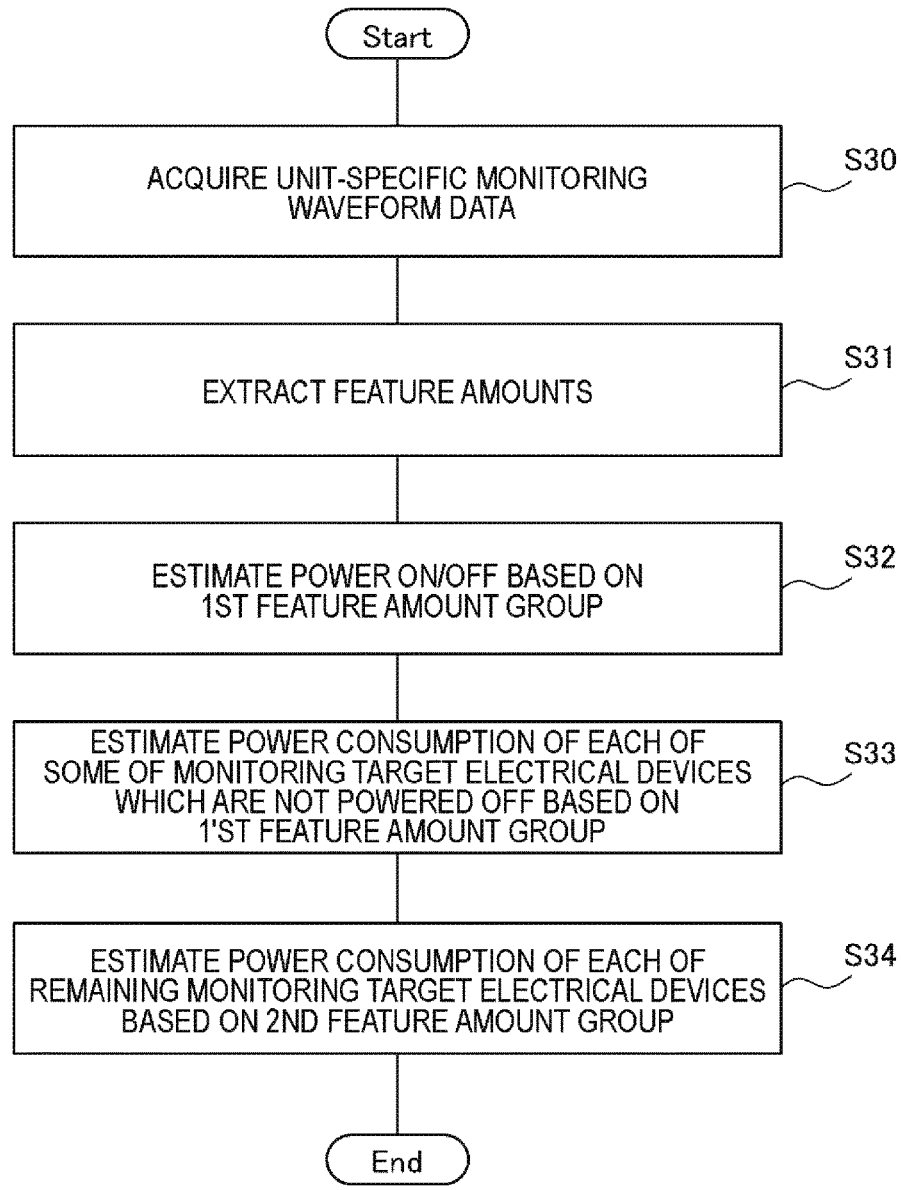
FIG. 20 is a flowchart illustrating an example of the flow of a process of the monitoring device according to the present exemplary embodiment.

Next, an example of the flow of a process of a monitoring method according to the present exemplary embodiment will be described with reference to the flowchart of FIG. 20. The following process may be either the real-time process or the batch process. In either case, the flow is the same as that described in the first exemplary embodiment.

The unit-specific waveform data acquisition unit 12 first acquires the unit-specific monitoring waveform data which is waveform data of at least one among the total current consumption, the total input voltage, and the total power consumption in the unit in which the monitoring target electrical devices are installed (S30).

Subsequently, the monitoring device 10 extracts predetermined kind of feature amount from the unit-specific monitoring waveform data acquired in S30 (S31).

Thereafter, the first inference unit 13 infers the operation states (power states) of at least some of the monitoring target electrical devices based on the 1st feature amount group among the feature amounts extracted in S31, and the training feature amounts stored in the storage unit 11 or the training feature amounts extracted from the device-specific training waveform data stored in the storage unit 11 (S32). This process is the same as, for example, S12 of FIG. 13.

Thereafter, the first inference unit 13 infers the operation states (power consumption) of at least some of the monitoring target electrical devices excluding the monitoring target electrical devices of which the power state is inferred to be the power-off state in S32 based on the 1'st feature amount group among the feature amounts extracted in S31, and the training feature amount stored in the storage unit 11 or the training feature amounts extracted from the device-specific training waveform data stored in the storage unit 11 (S33). This process is the same as, for example, S22 of FIG. 19.

Thereafter, the second inference unit 14 infers the operation states (power consumption) of the monitoring target electrical devices excluding the monitoring target electrical devices of which the power state is inferred to be the power-off state in S32 and the monitoring target electrical devices of which the power consumption is inferred in S33 (S34). Through the foregoing processes, the power consumption of each of the monitoring target electrical devices is inferred. This process is the same as, for example, S13 of FIG. 13 and S23 of FIG. 19.

According to the present exemplary embodiment, it is possible to realize the same operational effects as those of the first to third exemplary embodiments.

<Fifth Exemplary Embodiment>

An exemplary functional block diagram of the monitoring device 10 according to the present exemplary embodiment is the same as FIGS. 2, 16, and 21. The configurations of the storage unit 11, the unit-specific waveform data acquisition unit 12, and the output unit 15 are the same as those of the first to third exemplary embodiments.

The first inference unit 13 and the second inference unit 14 may not obtain the inference result by generating the inference model using the training data and inputting predetermined feature amounts extracted from the unit-specific monitoring waveform data into the generated inference model, but may specify the training feature amounts (including the sum training feature amounts) matching the predetermined feature amounts extracted from the unit-specific monitoring waveform data by sequentially collating the predetermined feature amounts extracted from the unit-specific monitoring waveform data with the training feature amounts (including the sum training feature amounts) included in the training data.

For example, the first inference unit 13 and the second inference unit 14 perform the process of generating the sum training feature amounts and a collation process in parallel. That is, when one sum training feature amount is generated, the collation process is performed. In a case in which the sum training feature amount is not matched, other sum training feature mounts are generated. Then, when the sum training feature amounts matching predetermined feature amounts extracted from the unit-specific monitoring waveform data are found, the process of generating the sum training feature amounts and the collation process accordingly end. The other remaining configurations of the first inference unit 13 and the second inference unit 14 are the same as those of the first to fourth exemplary embodiments.

According to the present exemplary embodiment, it is possible to realize the same operational effects as those of the first to fourth exemplary embodiments.

Here, examples of services achieved based on a result inferred by the monitoring device 10 according to the first to fifth exemplary embodiments will be described.

For example, it is possible to give an advice for power saving. In the monitoring device 10 according to the first to fifth exemplary embodiments, it is possible to ascertain a temporal change of the operation states of the electrical devices in a day (from 00:00 to 24:00). Based on such an output, it is possible to specify a time period in which the electrical devices are used a lot and give an advice of intentionally reducing the use of the electrical devices during the time period.

As another example, it is possible to give a notification of a timing of maintenance of an electrical device (for example, cleaning of an air-conditioner). In the monitoring device 10 according to the first to fifth exemplary embodiments, it is possible to calculate an accumulated operation time of each electrical device by accumulating inference results. For example, it is possible to give a notification to request maintenance at a timing at which an accumulative time becomes a predetermined value. A consumed current, a consumed power, a voltage, a measurement feature amount, and the like can be changed due to breakdown of an electrical device or deterioration of some components over time.

Accordingly, for example, it is possible to give a notification to give a request for maintenance when such change is detected.

As still another example, it is possible to give advice on use of a refrigerator. According to a loading state inside the refrigerator, a consumed current, a consumed power, a voltage, a measurement feature amount, and the like may change. In the monitoring device 10 according to the first to fifth exemplary embodiments, such change can be detected.

Based on the change, a warning against overstuffing or a request for increasing storage due to a decrease in storage can be notified of.

As still another example, in the monitoring device 10 according to the first to fifth exemplary embodiments, in comparison to a history of previous inference results, it is possible to detect whether a use pattern of electrical devices is different from at the normal time. In a case in which the user pattern of the electrical devices is different, there is a possibility of a certain change (for example, service receivers are sick or involved in cases) occurring in service receivers (users of the electronic devices). Accordingly, in such a case, a contact destination registered in advance can be notified of the warning.

As still another example, in the monitoring device 10 according to the first to fifth exemplary embodiments, a life rhythm or the like of a user can be inferred based on a use pattern of electronic devices (for example, a use pattern in a day). Accordingly, a warning of improving the life rhythm can be given to a user of an irregular life rhythm (for example, activities are considerable in the night (use of many electronic devices in the night) and day activities and night activities irregularly occur).

Hereinafter, examples of reference configurations will be appended.

1. A monitoring device including:
a unit-specific waveform data acquisition unit that acquires unit-specific monitoring waveform data which is waveform data of at least one among total current consumption, a total input voltage, and total power consumption in a unit in which monitoring target electrical devices are installed;
a first inference unit that infers operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and
a second inference unit that infers the operation states of some of the monitoring target electrical devices based on a 2nd feature amount group including at least one kind of feature amount extracted from the unit-specific monitoring waveform data, and different from the 1st feature amount group, and the training feature amount.

2. The monitoring device described in 1, further including:
a storage unit that stores at least one of device-specific training waveform data which is waveform data of at least one among current consumption, an input voltage, and power consumption, and the training feature amount at the time of the predetermined operation state extracted from the device-specific training waveform data in association with each of the monitoring target electrical devices,
wherein the first inference unit and the second inference unit perform the inference based on the training feature amount extracted from the device-specific training waveform data.

3. The monitoring device described in 1 or 2,
wherein the first inference unit infers whether the operation states of at least some of the monitoring target electrical devices are either a power-on state or a power-off state, and
wherein the second inference unit infers the power consumption of each of at least some of the monitoring target electrical devices excluding the monitoring target electrical device of which the operation state is inferred to be the power-off state by the first inference unit.

4. The monitoring device described in 3,
wherein the first inference unit infers whether the operation states of at least some of the monitoring target electrical devices are either the power-on state or the power-off state based on at least one of the training feature amount indicating that the monitoring target electrical device is in the power-on state, and the training feature amount indicating that the operation state of the monitoring target electrical device is changed between the power-on state and the power-off state.

5. The monitoring device described in 3 or 4,
wherein the second inference unit infers the power consumption of the monitoring target electrical device based on the training feature amount indicating that the power consumption of the monitoring target electrical device is a predetermined value.

6. The monitoring device described in 1 or 2,
wherein the first inference unit infers the power consumption of each of some of the monitoring target electrical devices, and
wherein the second inference unit infers the power consumption of each of at least some of the monitoring target electrical devices excluding the monitoring target electrical devices of which the power consumption is inferred by the first inference unit.

7. The monitoring device described in 6,
wherein the first inference unit and the second inference unit infer the power consumption of the monitoring target electrical device based on the training feature amount indicating that the power consumption of the monitoring target electrical device is a predetermined value.

8. The monitoring device described in anyone of 1 to 7, further including:
an output unit that outputs inference results by the first inference unit and the second inference unit.

9. A monitoring system including:
the monitoring device described in any one of 1 to 8; and
a repeating device that acquires unit-specific monitoring waveform data which is waveform data of at least one among total current consumption, a total input voltage, and total power consumption measured by a measuring instrument installed in a unit in which monitoring target electrical devices are installed and transmits the unit-specific monitoring waveform data to the monitoring device.

10. A monitoring method performed by a computer, the method including:
a unit-specific waveform data acquisition step of acquiring unit-specific monitoring waveform data which is waveform data of at least one among total current consumption, a total input voltage, and total power consumption in the unit in which monitoring target electrical devices are installed;
a first inference step of inferring operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and
a second inference step of inferring the operation states of some of the monitoring target electrical devices based on a 2nd feature amount group including at least one kind of feature amount extracted from the unit-specific monitoring waveform data, and different from the 1st feature amount group, and the training feature amount.

10-2. The monitoring method described in 10, the method of further performing, by the computer:

storing at least one of device-specific training waveform data which is waveform data of at least one among current consumption, an input voltage, and power consumption, and a training feature amount at the time of the predetermined operation state extracted from the device-specific training waveform data in association with each of the monitoring target electrical devices; and performing the inference based on the training feature amount extracted from the device-specific training waveform data, in the first and second inference steps.

10-3. The monitoring method described in 10 or 10-2, wherein in the first inference step, it is inferred whether the operation states of at least some of the monitoring target electrical devices are a power-on state or a power-off state, and wherein in the second inference step, the power consumption of each of at least some of the monitoring target electrical devices excluding the monitoring target electrical device of which the operation state is inferred to be the power-off state in the first inference step is inferred.

10-4. The monitoring method described in 10-3, wherein in the first inference step, whether the operation states of each of at least some of the monitoring target electrical devices is the power-on state or the power-off state is inferred based on at least one of the training feature amount indicating that the monitoring target electrical device is in the power-on state and the training feature amount indicating that the operation state of the monitoring target electrical device is changed between the power-on state and the power-off state.

10-5. The monitoring method described in 10-3 or 10-4, wherein in the second inference step, the power consumption of the monitoring target electrical device is inferred based on the training feature amount indicating that the power consumption of the monitoring target electrical device is a predetermined value.

10-6. The monitoring method described in 10 or 10-2, wherein in the first inference step, the power consumption of each of some of the monitoring target electrical devices is inferred, and wherein in the second inference step, the power consumption of each of at least some of the monitoring target electrical devices excluding the monitoring target electrical devices of which the power consumption is inferred in the first inference step is inferred.

10-7. The monitoring method described in 10-6, wherein in the first inference step and the second inference step, the power consumption of the monitoring target electrical device is inferred based on the training feature amount indicating that the power consumption of the monitoring target electrical device is a predetermined value.

10-8. The monitoring method described in any one of 10 to 10-7, the monitoring method of further performing, by the computer:

an output step of outputting inference results by the first inference unit and the second inference unit.

11. A program causing a computer to function as:

a unit-specific waveform data acquisition unit that acquires unit-specific monitoring waveform data which is waveform data of at least one among total current consumption, a total input voltage, and total power consumption in the unit in which monitoring target electrical devices are installed;

a first inference unit that infers operation states of at least some of the monitoring target electrical devices based on a 1st feature amount group including at least one kind of feature amount extracted from the unit-specific monitoring waveform data, and a training feature amount which is a feature amount of each of the monitoring target electrical devices in a predetermined operation state; and a second inference unit that infers the operation states of some of the monitoring target electrical devices based on a 2nd feature amount group including at least one kind of feature amount extracted from the unit-specific monitoring waveform data, and different from the 1st feature amount group, and the training feature amount.

11-2. The program described in 11 causing a computer to function as:

a storage unit that stores at least one of device-specific training waveform data which is waveform data of at least one among current consumption, an input voltage, and power consumption, and a training feature amount at the time of the predetermined operation state extracted from the device-specific training waveform data in association with each of the monitoring target electrical devices, wherein the first inference unit and the second inference unit are caused to perform the inference based on the training feature amount extracted from the device-specific training waveform data.

11-3. The program described in 11 or 11-2, wherein the first inference unit infers whether the operation states of at least some of the monitoring target electrical devices is either a power-on state or a power-off state, and wherein the second inference unit infers the power consumption of each of at least some of the monitoring target electrical devices excluding the monitoring target electrical device of which the operation state is inferred to be the power-off state by the first inference unit.

11-4. The program described in 11-3, wherein the first inference unit is caused to infer whether the operation states of at least some of the monitoring target electrical devices is either the power-on state or the power-off state based on at least one of the training feature amount indicating that the monitoring target electrical device is in the power-on state, and the training feature amount indicating that the operation state of the monitoring target electrical device is changed between the power-on state and the power-off state.

11-5. The program described in 11-3 or 11-4, wherein the second inference unit is caused to infer the power consumption of the monitoring target electrical device based on the training feature amount indicating that the power consumption of the monitoring target electrical device is a predetermined value.

11-6. The program described in 11 or 11-2, wherein the first inference unit is caused to infer the power consumption of each of some of the monitoring target electrical devices, and wherein the second inference unit is caused to infer the power consumption of each of at least some of the monitoring target electrical devices excluding the monitoring target electrical devices of which the power consumption is inferred by the first inference unit.

11-7. The program described in 11-6, wherein the first inference unit and the second inference unit are caused to infer the power consumption of the monitoring target electrical device based on the training feature amount indicating that the power consumption of the monitoring target electrical device is a predetermined value.

11-8. The program described in any one of 11 to 11-7, further causing the computer to function as:
an output unit that outputs inference results by the first inference unit and the second inference unit.

This application claims priority from Japanese Patent Application No. 2014-071121 filed on Mar. 31, 2014, the content of which is incorporated herein by reference in its entirety.

The invention claimed is:

1. A monitoring device comprising:
a measuring instrument that acquires unit-specific monitoring waveform data, including waveform data of at least one of a total current consumption, a total input voltage, and a total power consumption in a unit in which monitoring target electrical devices are installed;
a memory storing instructions; and
a processor executing the stored instructions to:
infer operation states of at least some of the monitoring target electrical devices based on
a 1 st feature amount group including at least one kind of feature amount extracted from the unit-specific monitoring waveform data, and
a training feature amount which is a feature amount of each of the monitoring target electrical devices in a predetermined operation state; and
infer the operation states of some of the monitoring target electrical devices based on
a 2 nd feature amount group including at least one kind of feature amount extracted from the unit-specific monitoring waveform data, and different from the 1 st feature amount group, and
the training feature amount.

2. The monitoring device according to claim 1, further comprising:
a storage unit that stores at least one of
device-specific training waveform data, including waveform data of at least one of a current consumption, an input voltage, and a power consumption, and
the training feature amount at the time of the predetermined operation state extracted from the device-specific training waveform data in association with each of the monitoring target electrical devices,
wherein the processor is further configured to execute the stored instructions to infer the operating states based on the training feature amount extracted from the device-specific training waveform data.

3. The monitoring device according to claim 1, wherein the processor is further configured to execute the stored instructions to infer
whether the operation states of at least some of the monitoring target electrical devices are either a power-on state or a power-off state, and
the power consumption of each of at least some of the monitoring target electrical devices excluding the monitoring target electrical device of which the operation state is inferred to be the power-off state by the first inference unit.

4. The monitoring device according to claim 3, wherein the processor is further configured to execute the stored instructions to infer whether the operation states of at least some of the monitoring target electrical devices are either the power-on state or the power-off state based on at least one of
the training feature amount indicating that the monitoring target electrical device is in the power-on state, and
the training feature amount indicating that the operation state of the monitoring target electrical device is changed between the power-on state and the power-off state.

5. The monitoring device according to claim 3, wherein the processor is further configured to execute the stored instructions to infer the power consumption of the monitoring target electrical device based on the training feature amount indicating that the power consumption of the monitoring target electrical device is a predetermined value.

6. The monitoring device according to claim 1, wherein the processor is further configured to execute the stored instructions to infer
the power consumption of each of some of the monitoring target electrical devices, and
the power consumption of each of at least some of the monitoring target electrical devices excluding the monitoring target electrical devices of which the power consumption is inferred by the first inference unit.

7. The monitoring device according to claim 6, wherein the processor is further configured to execute the stored instructions to infer the power consumption of the monitoring target electrical device based on the training feature amount indicating that the power consumption of the monitoring target electrical device is a predetermined value.

8. The monitoring device according to claim 1, further comprising:
a display that displays inference results from the processor.

9. A monitoring system comprising:
the monitoring device according to claim 1; and
a repeating device, including:
a receiver that receives unit-specific monitoring waveform data measured by the measuring instrument installed in a unit in which monitoring target electrical devices are installed; and
a transmitter that transmits the unit-specific monitoring waveform data to the monitoring device.

10. The monitoring device according to claim 1, further including a printer that outputs inference results from the processor.

11. The monitoring device according to claim 1, further including a mailer that outputs inference results from the processor.

12. A monitoring method comprising:
acquiring, using a measuring instrument, unit-specific monitoring waveform data, including waveform data of at least one of a total current consumption, a total input voltage, and a total power consumption in a unit in which monitoring target electrical devices are installed;
inferring, using a processor, operation states of at least some of the monitoring target electrical devices based on
a 1 st feature amount group including at least one kind of feature amount extracted from the unit-specific monitoring waveform data, and
a training feature amount which is a feature amount of each of the monitoring target electrical devices in a predetermined operation state; and
inferring, using the processor, the operation states of some of the monitoring target electrical devices based on
a 2 nd feature amount group including at least one kind of feature amount extracted from the unit-specific monitoring waveform data, and different from the 1 st feature amount group, and
the training feature amount.

13. A non-transitory storage medium storing a program, wherein the program includes instructions, when executed by a computing device, cause the device to:
- acquire unit-specific monitoring waveform data, including waveform data of at least one of a total current consumption, a total input voltage, and a total power consumption in the unit in which monitoring target electrical devices are installed;
- infer operation states of at least some of the monitoring target electrical devices based on
  - a 1 st feature amount group including at least one kind of feature amount extracted from the unit-specific monitoring waveform data, and
  - a training feature amount which is a feature amount of each of the monitoring target electrical devices in a predetermined operation state; and
- infer the operation states of some of the monitoring target electrical devices based on
  - a 2 nd feature amount group including at least one kind of feature amount extracted from the unit-specific monitoring waveform data, and different from the 1st feature amount group, and
  - the training feature amount.

* * * * *